(12) United States Patent
Suzuki et al.

(10) Patent No.: US 12,520,549 B2
(45) Date of Patent: Jan. 6, 2026

(54) SILICON CARBIDE SEMICONDUCTOR DEVICE INCLUDING ALTERNATELY PROVIDED PILLARS HAVING DIFFERENT IMPURITY CONCENTRATIONS

(71) Applicants: Kabushiki Kaisha Toshiba, Tokyo (JP); Toshiba Electronic Devices & Storage Corporation, Tokyo (JP)

(72) Inventors: Takuma Suzuki, Himeji Hyogo (JP); Hiroshi Kono, Himeji Hyogo (JP); Katsuhisa Tanaka, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 631 days.

(21) Appl. No.: 17/897,753

(22) Filed: Aug. 29, 2022

(65) Prior Publication Data

US 2023/0307501 A1 Sep. 28, 2023

(30) Foreign Application Priority Data

Mar. 24, 2022 (JP) ................................ 2022-047930

(51) Int. Cl.
*H10D 62/832* (2025.01)
*H10D 62/10* (2025.01)

(52) U.S. Cl.
CPC ....... *H10D 62/8325* (2025.01); *H10D 62/111* (2025.01)

(58) Field of Classification Search
CPC .... H10D 62/8325; H10D 62/111; H10D 8/00; H10D 8/60; H10D 30/66; H10D 30/668;
(Continued)

(56) References Cited

U.S. PATENT DOCUMENTS

| 10,700,166 B2 | 6/2020 | Kai et al. |
| 11,031,473 B2 | 6/2021 | Bauer et al. |

(Continued)

FOREIGN PATENT DOCUMENTS

| JP | 2012-064659 A | 3/2012 |
| JP | 2013-168458 A | 8/2013 |

(Continued)

OTHER PUBLICATIONS

Office Action issued in Japanese Patent Application No. 2022-047930 dated Mar. 28, 2025 in 14 pages.

*Primary Examiner* — Norman D Richards
(74) *Attorney, Agent, or Firm* — Knobbe, Martens, Olson & Bear, LLP

(57) ABSTRACT

According to one embodiment, a silicon carbide semiconductor device includes a first electrode, a second electrode, a first semiconductor layer, a plurality of first semiconductor pillar regions of a first conductivity type, a second semiconductor pillar region of a second conductivity type. The first semiconductor pillar regions include a first region has a first impurity concentration and second region has a second impurity concentration higher than the first impurity concentration. The second semiconductor pillar regions include a third region has a third impurity concentration and a fourth region has a fourth impurity concentration higher than the third impurity concentration.

14 Claims, 25 Drawing Sheets

(58) Field of Classification Search
CPC .. H10D 62/129; H10D 62/393; H10D 62/106; H10D 62/107; H10D 62/105; H10D 62/124; H10D 30/63
USPC .......................................................... 257/77
See application file for complete search history.

(56) References Cited

U.S. PATENT DOCUMENTS

| | | | |
|---|---|---|---|
| 2015/0115286 A1* | 4/2015 | Takeuchi | H10D 64/256 |
| | | | 257/77 |
| 2015/0171169 A1 | 6/2015 | Harada | |
| 2017/0092717 A1* | 3/2017 | Meiser | H10D 62/127 |
| 2018/0061938 A1* | 3/2018 | Fragiacomo | H02M 7/217 |
| 2021/0288156 A1 | 9/2021 | Fukui et al. | |

FOREIGN PATENT DOCUMENTS

| | | | |
|---|---|---|---|
| JP | 2020-511773 A | 4/2020 | |
| JP | 2021-182639 A | 11/2021 | |
| WO | 2013/179820 A1 | 12/2013 | |
| WO | WO 2013/187017 A1 | 12/2013 | |

* cited by examiner

FIG. 6
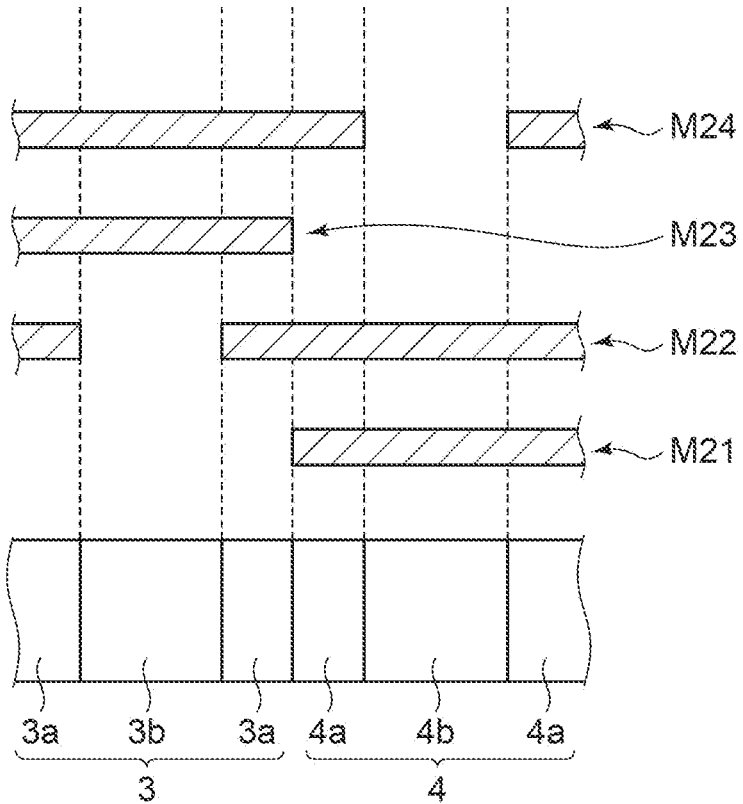
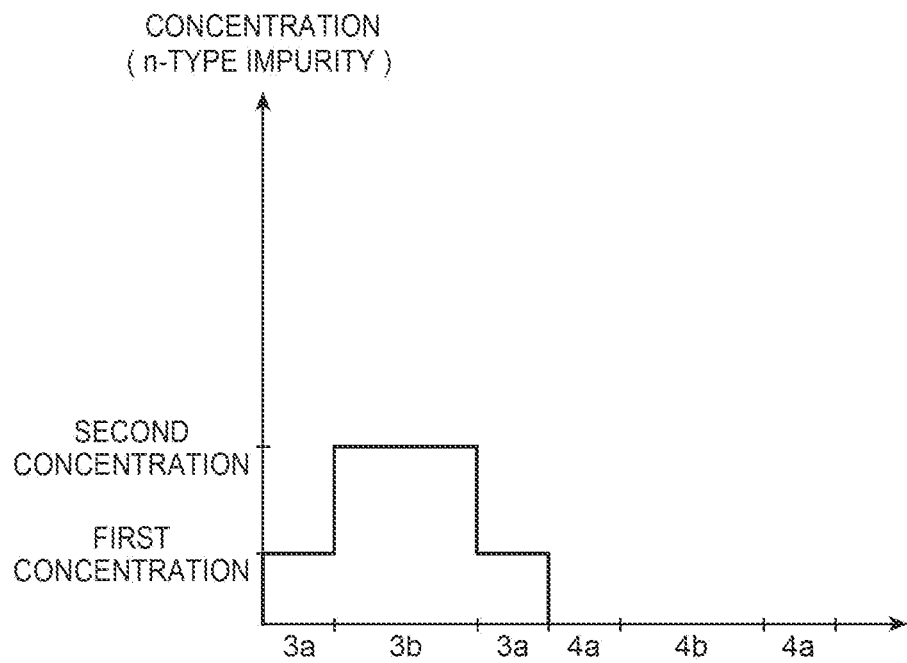
FIG. 7

SILICON CARBIDE SEMICONDUCTOR DEVICE INCLUDING ALTERNATELY PROVIDED PILLARS HAVING DIFFERENT IMPURITY CONCENTRATIONS

CROSS-REFERENCE TO RELATED APPLICATIONS

This application is based upon and claims the benefit of priority from Japanese Patent Application No. 2022-047930, filed on Mar. 24, 2022; the entire contents of which are incorporated herein by reference.

FIELD

Embodiments relate to a silicon carbide semiconductor device.

BACKGROUND

A semiconductor device made of silicon carbide and used for power control is expected to have a higher breakdown voltage than a semiconductor device made of silicon.

For example, when a high voltage is switched to, a drain-source voltage (Vds) surge may be generated during a turn-off operation. Such a Vds surge is desired to be reduced.

BRIEF DESCRIPTION OF THE DRAWINGS

FIG. 6 is a schematic cross-sectional view showing masks.

FIG. 7 is a profile of an n-type impurity concentration of the silicon carbide semiconductor device in the first embodiment.

DETAILED DESCRIPTION

Figure 1:
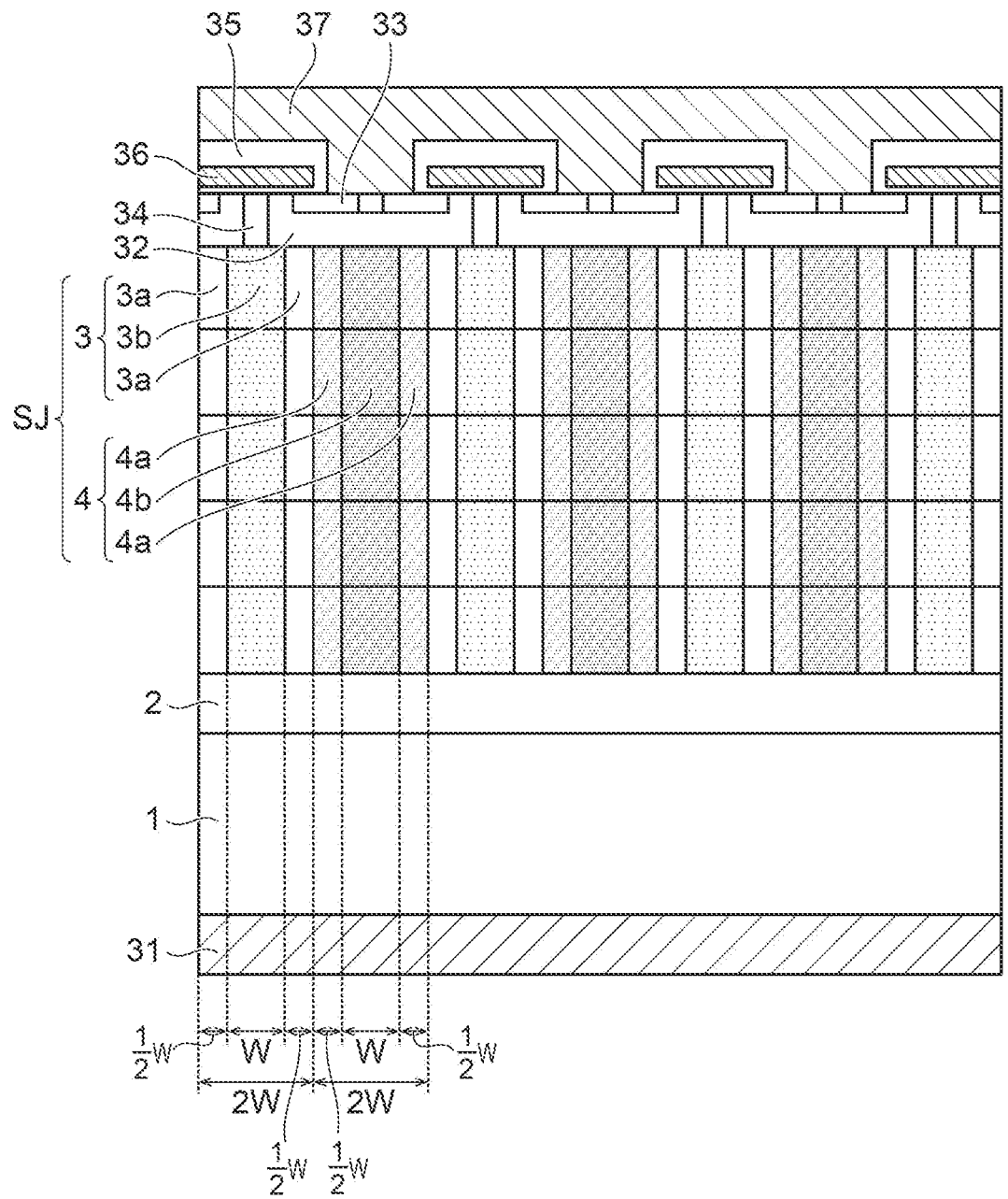
FIG. 1 is a schematic cross-sectional view showing an example of a structure of a silicon carbide semiconductor device in the first embodiment.

In general, according to one embodiment, a silicon carbide semiconductor device includes a first electrode, a second electrode, a first semiconductor layer, a plurality of first semiconductor pillar regions of a first conductivity type, a second semiconductor pillar region of a second conductivity type. the first semiconductor layer provided between the first electrode and the second electrode and containing silicon carbide. the plurality of first semiconductor pillar regions of a first conductivity type contains silicon carbide. The first semiconductor pillar regions being provided between the first semiconductor layer and the second electrode. The first semiconductor pillar regions each includes a first region has a first impurity concentration and a second region provided together with the first region in a second direction orthogonal to a first direction from the first electrode toward the second electrode and has a second impurity concentration higher than the first impurity concentration. The second semiconductor pillar region of a second conductivity type contains silicon carbide. The second semiconductor pillar region being provided between the first semiconductor layer and the second electrode and located between the first semiconductor pillar regions in the second direction. The second semiconductor pillar region includes a third region has a third impurity concentration and a fourth region provided together with the third region in the second direction and has a fourth impurity concentration higher than the third impurity concentration.

Hereinafter, embodiments of the invention will be described with reference to the drawings.

The drawings are schematic or conceptual, and the relationship between the thickness and the width of each portion, the ratio of sizes among portions, and the like are not necessarily the same as the actual ones. Dimensions and ratios even for identical portions may be shown differently depending on drawings.

In the description and the drawings, components similar to those described previously with reference to drawings referred to are indicated with the same reference numerals, and a detailed description thereof is omitted appropriately.

First Embodiment

FIG. 1 is a schematic cross-sectional view showing an example of a structure of a silicon carbide semiconductor device 30 made of silicon carbide (SiC). In the embodiment, as an example, a first conductivity type will be described as an n-type, and a second conductivity type will be described as a p-type. In FIG. 1, a direction from a drain electrode (first electrode) 31 toward a source electrode (second electrode) 37 is referred to as a first direction, and a direction orthogonal to the first direction is referred to as a second direction. A direction orthogonal to the first direction and the second direction is referred to as a third direction.

FIG. 1 is a schematic cross-sectional view showing an example of the structure of the silicon carbide semiconductor device 30 according to the embodiment.

A substrate 1 is, for example, a single crystal bulk substrate made of silicon carbide. In the embodiment, the substrate 1 is, for example, an n-type substrate. A concentration of an n-type impurity contained in the substrate 1 is, for example, $1 \times 10^{20}/cm^3$. A thickness of the substrate 1 is, for example, 350 μm to 500 μm. The n-type impurity is, for example, nitrogen (N) or phosphorus (P).

A semiconductor layer 2 is formed on a major surface of the substrate 1 by epitaxial growth and is made of silicon carbide. The semiconductor layer 2 is, for example, an n-type semiconductor layer. A concentration of the n-type impurity of the semiconductor layer 2 is, for example, $1 \times 10^{18}/cm^3$. A thickness of the semiconductor layer 2 is, for example, 3 μm.

A super-junction layer SJ made of silicon carbide is stacked in a direction (first direction) substantially perpendicular to a major surface of the semiconductor layer 2. The super-junction layer SJ has a periodic structure in which a first semiconductor pillar region 3 and a second semiconductor pillar region 4 are alternately provided together in a direction (second direction) substantially parallel to the major surface of the semiconductor layer 2.

The first semiconductor pillar region 3 is an n-type pillar region containing the n-type impurity. The first semiconductor pillar region 3 includes first regions 3a having a first concentration (first impurity concentration) and a second region 3b having a second concentration (second impurity concentration) higher than the first concentration. In the direction (second direction) substantially parallel to the major surface of the semiconductor layer 2, the second region 3b is formed between two first regions 3a. In the embodiment, a conductivity type of the first semiconductor pillar region 3 is, for example, n-type. The n-type impurity is, for example, nitrogen (N) or phosphorus (P). The first concentration of each first region 3a is desired to be $1 \times 10^{16}/cm^3$ to $1 \times 10^{17}/cm^3$, and is $5 \times 10^{16}/cm^3$ in the embodiment. The second concentration of the second region 3b is desired to be $5 \times 10^{16}/cm^3$ to $5 \times 10^{17}/cm^3$, and is $1 \times 10^{17}/cm^3$ in the embodiment. A width (½)W of the first region 3a is, for example, 0.5 μm, and a width W of the second region 3b is, for example, 1.0 μm. In the embodiment, "width" indicates a length in the direction substantially parallel to the major surface of the semiconductor layer 2.

The second semiconductor pillar region 4 is a p-type pillar region containing a p-type impurity. The second semiconductor pillar region 4 includes third regions 4a having a third concentration (third impurity concentration) and a fourth region 4b having a fourth concentration (fourth impurity concentration) higher than the third concentration. In the direction (second direction) substantially parallel to the major surface of the semiconductor layer 2, the fourth region 4b is formed between two third regions 4a. In the embodiment, a conductivity type of the second semiconductor pillar region 4 is, for example, p-type. The p-type impurity is, for example, boron (B) or aluminum (Al). The third concentration of each third region 4a is desired to be $1 \times 10^{16}/cm^3$ to $1 \times 10^{17}/cm^3$, and is $5 \times 10^{16}/cm^3$ in the embodiment. The fourth concentration of the fourth region 4b is desired to be $5 \times 10^{16}/cm^3$ to $5 \times 10^{17}/cm^3$, and is $1 \times 10^{17}/cm^3$ in the embodiment. A width (½)W of the third region 4a is, for example, 0.5 μm, and a width W of the fourth region 4b is, for example, 1.0 μm.

The first semiconductor pillar region 3 and the second semiconductor pillar region 4 have a predetermined pillar depth by repeating epitaxial growth and ion implantation of the n-type impurity and the p-type impurity. A thickness of the super-junction layer SJ formed in such a manner is, for example, 10.0 μm. A thickness of one epitaxially grown layer is desired to be, for example, 0.5 μm to 4.0 μm, and is, for example, 2.0 μm in the embodiment. A breakdown voltage of a semiconductor element including the substrate 1, the semiconductor layer 2, and the super-junction layer SJ is, for example, 1200 V.

Figure 2:
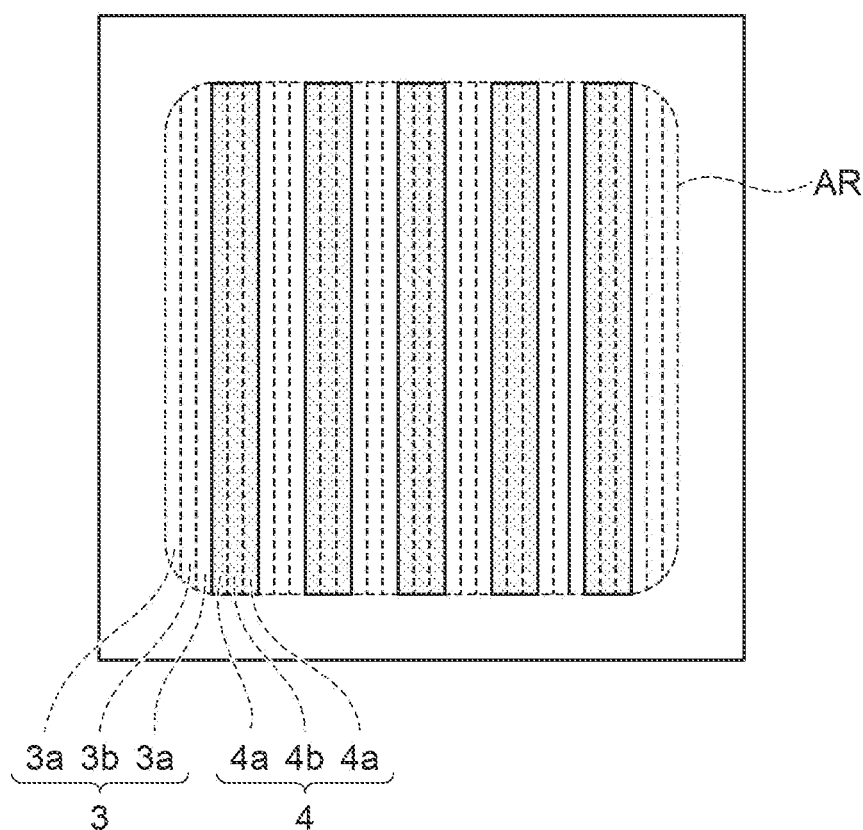
FIG. 2 is a planar pattern showing an example of a first semiconductor pillar regions and a second semiconductor pillar regions in the first embodiment.
Figure 3:
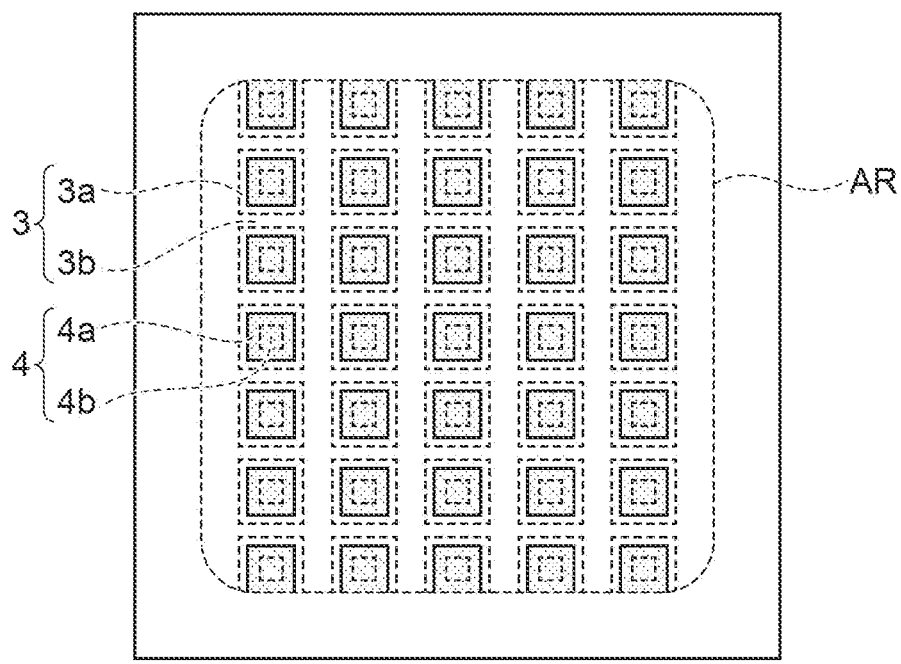
FIG. 3 is a planar pattern showing an example of the first semiconductor pillar regions and the second semiconductor pillar regions in the first embodiment.

A planar pattern of the first semiconductor pillar region 3 and a planar pattern of the second semiconductor pillar region 4 on the major surface of the semiconductor layer 2 may have a stripe shape extending in the third direction as shown in FIG. 2, or may have an island shape as shown in FIG. 3. In FIG. 3, the second semiconductor pillar region 4 is a rectangular region, and the first semiconductor pillar region 3 is a rectangular region surrounding the second semiconductor pillar region 4. In FIGS. 2 and 3, AR indicates an active region, and FIG. 1 shows a cross-sectional structure in the active region AR.

The drain electrode 31 is formed on a face of the substrate 1 opposite to the face of the substrate 1 on which the semiconductor layer 2 is formed. A p base 32 is formed on an upper side surface of the super-junction layer SJ. The p base 32 is formed on an upper side of the second semiconductor pillar region 4 and has two ends connected to a part of the respective second regions 3b of the first semiconductor pillar regions 3 contiguous to the second semiconductor pillar region 4. A source layer 33 is formed on a part of an upper side surface of the p base 32. In the source layer 33, a central portion is formed in the same p-type as the region 4b, and end portions are formed in the n-type. A pillar 34 is formed between two p bases 32. The pillar 34 is, for example, an n-type pillar.

An insulating film 35 overlaps end portions of two adjacent source layers 33. The insulating film 35 includes a gate electrode 36. The insulating film 35 is made of silicon dioxide ($SiO_2$) on the source layer 33 side. The insulating film 35 is made of silicon dioxide on a side opposite to the source layer 33. The gate electrode 36 is, for example, a p-type gate electrode doped with boron and made of polysilicon. The gate electrode 36 may also be an n-type gate electrode doped with phosphorus. The source electrode 37 is formed on upper sides of the source layer 33 and the insulating film 35. That is, the silicon carbide semiconductor device 30 according to the embodiment is a planar gate super-junction metal-oxide-semiconductor field-effect transistor (SJ-MOSFET) type silicon carbide semiconductor device.

Next, a method for forming the super-junction layer SJ of the silicon carbide semiconductor device 30 will be described.

Figure 4:
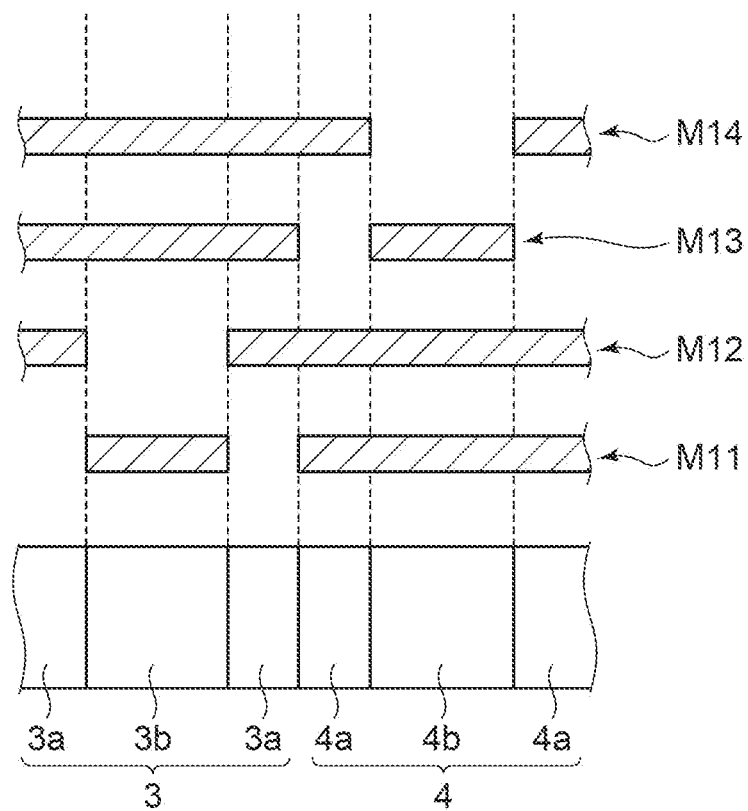
FIG. 4 is a schematic cross-sectional view showing masks.
Figure 5:
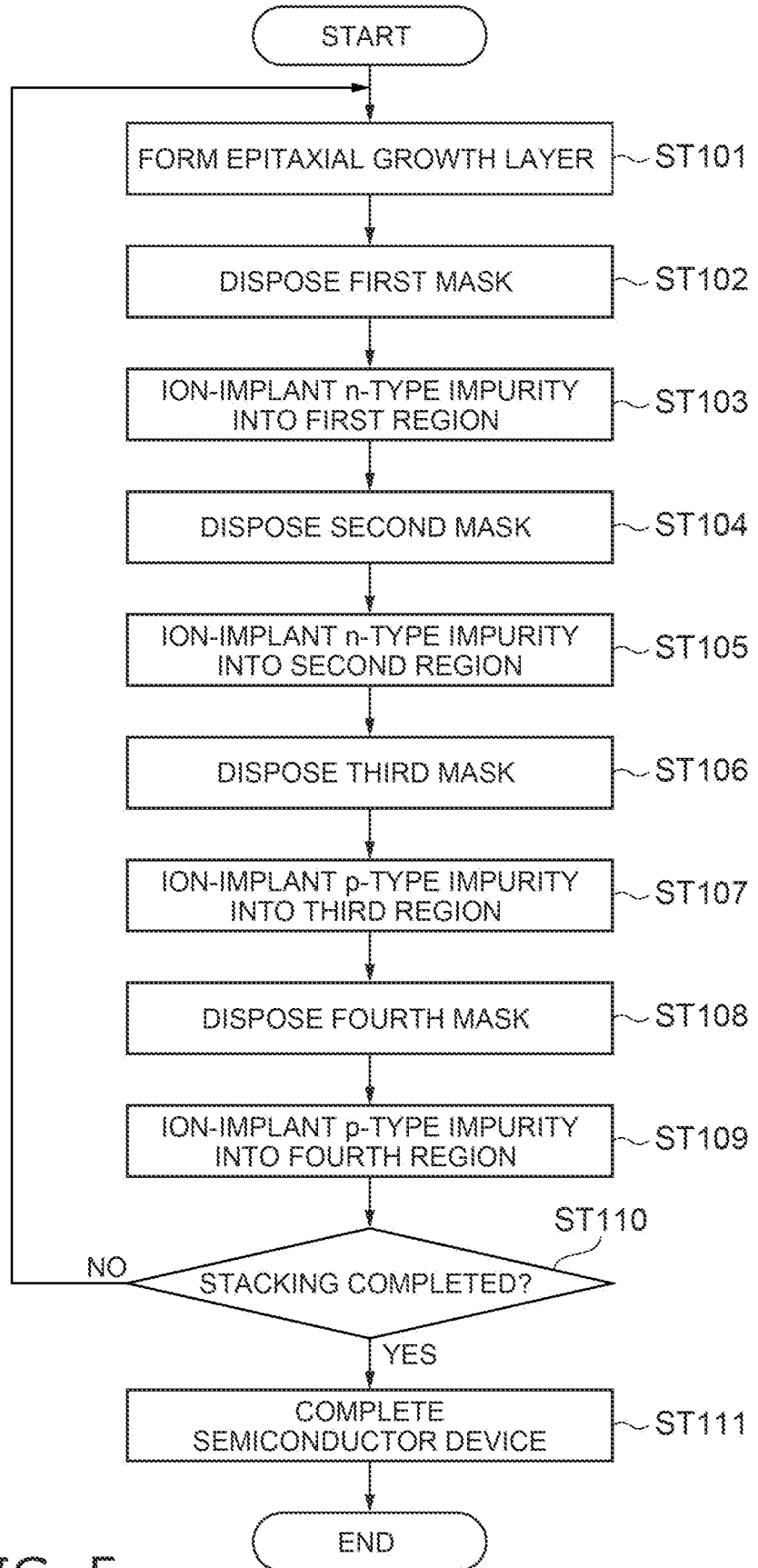
FIG. 5 is a flowchart showing an example of the method for forming the super-junction layer.

FIG. 4 is a schematic cross-sectional view showing masks used for forming the super-junction layer SJ, and FIG. 5 is a flowchart showing an example of the method for forming the super-junction layer SJ.

As shown in FIG. 4, for example, four masks M11 to M14 are used to form the super-junction layer SJ. In order to easily understand differences between the masks M11 to M14, the masks M11 to M14 are shown together above the first semiconductor pillar region 3 and the second semiconductor pillar region 4. The mask M11 is used to form the first region 3a, the mask M12 is used to form the second region 3b, the mask M13 is used to form the third region 4a, and the mask M14 is used to form the fourth region 4b. Therefore, openings of the masks M11 to M14 have the same sizes as that of the first region 3a, the second region 3b, the third region 4a, and the fourth region 4b, respectively. Each of the masks M11 to M14 is an ion implantation mask formed by performing photolithography and dry etching on a $SiO_2$ film (UDO: un-doped oxide) having a film thickness for exhibiting a sufficient ion implantation blocking ability and deposited on a major surface of the super-junction layer SJ by a chemical vapor deposition (CVD) method. This $SiO_2$ mask favorably has a film thickness of 0.5 µm to 2.0 µm, and is, for example, 1 µm. In addition, a mask material having a sufficient ion implantation blocking ability and a thickness may be appropriately selected.

As shown in FIG. 5, for example, an epitaxial growth layer made of silicon carbide is formed on the substrate 1 or on upper sides of the first semiconductor pillar region 3 and the second semiconductor pillar region 4 that are previously formed (ST101). Next, the mask M11 is disposed on an upper side of the epitaxial growth layer (ST102), and the n-type impurity is ion-implanted into a portion corresponding to the first region 3a so that the portion corresponding to the first region 3a has the first concentration (ST103).

Next, the mask M12 is disposed on the upper side of the epitaxial growth layer (ST104), and the n-type impurity is ion-implanted into a portion corresponding to the second region 3b so that the portion corresponding to the second region 3b has the second concentration (ST105). Next, the mask M13 is disposed on the upper side of the epitaxial growth layer (ST106), and the p-type impurity is ion-implanted into a portion corresponding to the third region 4a so that the portion corresponding to the third region 4a has the third concentration (ST107). Next, the mask M14 is disposed on the upper side of the epitaxial growth layer (ST108), and the p-type impurity is ion-implanted into a portion corresponding to the fourth region 4b so that the portion corresponding to the fourth region 4b has the fourth concentration (ST109).

Then, it is determined whether stacking is completed (ST110), and when the stacking as predetermined is not completed (ST110: NO), the process returns to ST101 to execute the process of ST101 to ST109. When the stacking is completed (ST110: YES), the p base 32 and the like is formed, annealing treatment, and the like is performed, and the semiconductor device is completed (ST111). Accordingly, the first region 3a having the first concentration, the second region 3b having the second concentration, the third region 4a having the third concentration, and the fourth region 4b having the fourth concentration are formed.

In the specific example, the first region 3a, the second region 3b, the third region 4a, and the fourth region 4b are formed using the masks M11 to M14 described in FIG. 4, but the invention is not limited thereto and may use masks M21 to M24 shown in FIG. 6.

Openings of the masks M21 and M23 correspond to the first semiconductor pillar region 3 (the first regions 3a and the second region 3b) and the second semiconductor pillar region 4 (the third regions 4a and the fourth region 4b) respectively, and openings of the masks M22 and M24 correspond to the second region 3b and the fourth region 4b respectively.

When the masks M21 to M24 are used, first, the mask M21 is used to ion-implant an impurity into the first semiconductor pillar region 3 and form a region having the first concentration, and then the mask M22 is used to form the second region 3b having the second concentration. Similarly, the mask M23 is used to ion-implant an impurity into the second semiconductor pillar region 4 and form a region having the third concentration, and then the mask M24 is used to ion-implant an impurity and form the fourth region 4b having the fourth concentration. In such a manner, the super-junction layer SJ may be formed.

Next, a profile of impurity concentrations of the silicon carbide semiconductor device 30 will be described.

Figure 8:
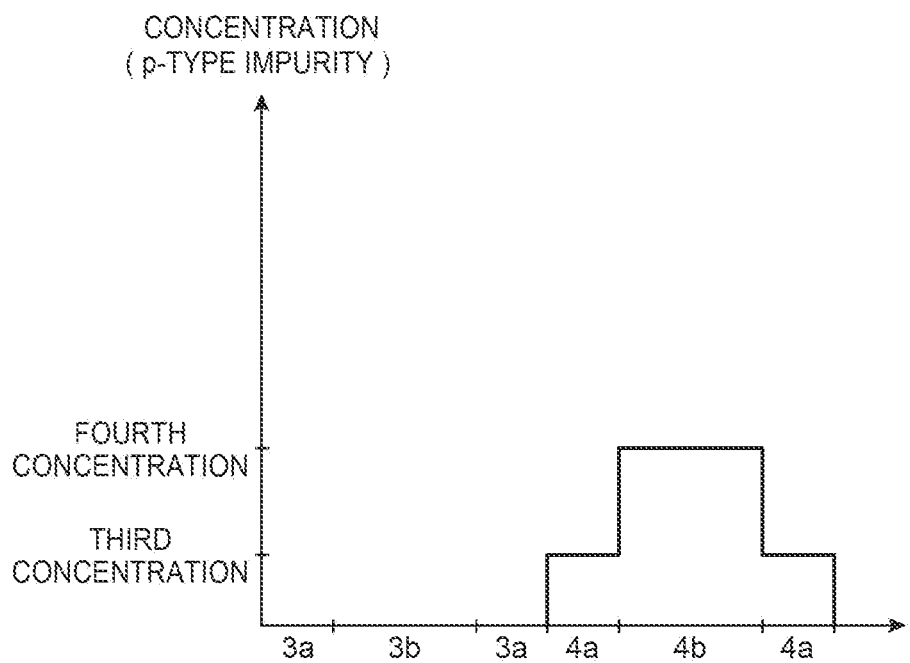
FIG. 8 is a profile of a p-type impurity concentration of the silicon carbide semiconductor device in the first embodiment.

FIG. 7 is a profile of an n-type impurity concentration, and FIG. 8 is a profile of a p-type impurity concentration. The profiles shown in FIGS. 7 and 8 are, for example, cross sections shown in FIG. 1 and profiles of the impurity concentrations at a predetermined depth of the super-junction layer SJ. In addition, in the description, "impurity concentration" refers to an effective impurity concentration contributing to conduction of a semiconductor, and when both an impurity serving as a donor and an impurity serving as an acceptor are contained in a certain region, the "impurity concentration" refers to a concentration excluding offset.

As shown in FIG. 7, in the profile of the n-type impurity, the two first regions 3a have the first concentration, and the second region 3b between the two first regions 3a has the second concentration. As shown in FIG. 8, in the profile of the p-type impurity, the two third regions 4a have the third concentration, and the fourth region 4b between the two third regions 4a has the fourth concentration. Accordingly, the profiles of the n-type impurity and the p-type impurity are stepwise, and are so-called box profiles.

Next, operations of the silicon carbide semiconductor device 30 will be described.

In the silicon carbide semiconductor device 30, when a predetermined voltage is applied to the gate electrode 36, a channel is formed near a surface of the p base 32 immediately below the gate electrode 36, and the source layer 33 is conducted to the first semiconductor pillar region 3. As a result, a major current path is formed between the source electrode 37 and the drain electrode 31 through the source layer 33, the first semiconductor pillar region 3, and the semiconductor layer 2, and major electrodes are turned on. Thus, the silicon carbide semiconductor device 30 is energizable. When the voltage applied to the gate electrode 36 is stopped, the channel formed near the surface of the p base 32 immediately below the gate electrode 36 disappears, and the source layer 33 is not conducted to the first semiconductor pillar region 3. As a result, the major current path is not formed between the source electrode 37 and the drain electrode 31, and the major electrodes are turned off. In such a manner, in the silicon carbide semiconductor device 30, an on state and an off state are switched to. Switching from the on state to the off state is referred to as turn-off, and switching from the off state to the on state is referred to as turn-on.

Figures 9A, 9B:
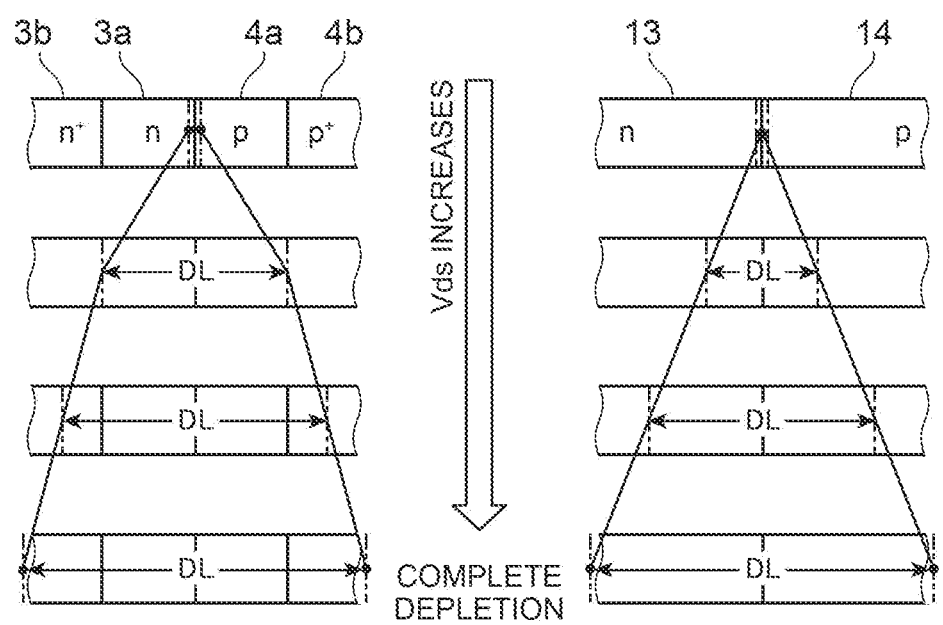
FIGS. 9A and 9B are conceptual diagrams showing a spread of a depletion layer at turn-off time in the silicon carbide semiconductor device according to the first embodiment and in a semiconductor device according to a comparative example.

FIGS. 9A and 9B are conceptual diagrams showing a spread of a depletion layer at turn-off time in the silicon carbide semiconductor device 30 according to the embodiment and in a semiconductor device according to a comparative example. FIG. 9A shows a spread of a depletion layer DL in the first semiconductor pillar region 3 and the second semiconductor pillar region 4 of the silicon carbide semiconductor device 30, and FIG. 9B shows the spread of the depletion layer DL in an n-type pillar region 13 and a p-type pillar region 14 as the comparative example. FIGS. 9A and 9B show how the depletion layer DL spreads from a p-n interface, and show a chronological change in four stages in order from top. In FIGS. 9A and 9B, a drain-source voltage (Vds) also increases chronologically. The pillar regions 13 and 14 according to the comparative example have a structure in which impurity concentrations are substantially uniform, that is, the first regions 3a and the third regions 4a in the silicon carbide semiconductor device 30 according to the embodiment are not provided.

In either case, the depletion layer DL spreads to left and right pillar regions as the Vds increases at the turn-off time. In the case of the comparative example, the depletion layer DL spreads at once as the Vds increases, and the pillar regions 13 and 14 are completely depleted. In contrast, in the semiconductor device 30 according to the embodiment, after the depletion layer DL spreads to the first regions 3a and the third regions 4a as the Vds increases, the depletion layer DL is prevented from spreading since impurity concentrations are high in the second region 3b and the fourth region 4b. That is, a spreading speed of the depletion layer DL before complete depletion is slower, and the depletion layer spreads gently.

Figure 10:
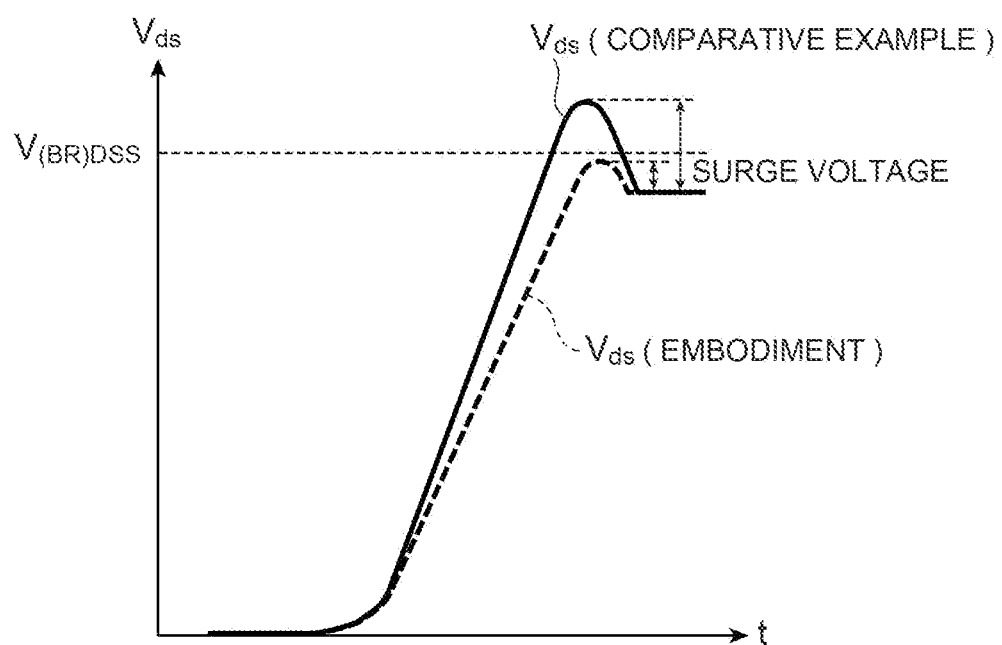
FIG. 10 is a graph illustrating a change in Vds shown in FIG. 9.

FIG. 10 is a graph illustrating a change in Vds shown in FIG. 9. In FIG. 10, a horizontal axis represents elapsed time in the turn-off state, and a vertical axis represents a voltage V. When the depletion layer DL spreads at once and the pillar regions 13 and 14 are sharply completely depleted during a turn-off operation, a rapid change in feedback capacitance Crss occurs, and thus the Vds jumps up and a so-called surge is generated. The feedback capacitance Crss is equal to gate-drain capacitance Cgd. V(BR)DSS is a drain-source breakdown voltage. The V(BR)DSS is the breakdown voltage between the drain electrode and the source electrode. In the comparative example, it is indicated that the generated surge exceeds the V(BR)DSS.

In contrast, in the first semiconductor pillar region 3 and the second semiconductor pillar region 4 of the silicon carbide semiconductor device 30 according to the embodiment, impurity concentrations (the second concentration, the fourth concentration) of pillar central portions (the second region 3b, the fourth region 4b) are high, and impurity concentrations (the first concentration, the third concentration) of regions (the first regions 3a, the third regions 4a) contiguous to the pillar central portions are low. That is, in the silicon carbide semiconductor device 30 according to the embodiment, both the first semiconductor pillar region 3 and the second semiconductor pillar region 4 include regions having clearly different impurity concentrations.

According to the embodiment, as illustrated in FIG. 9A, by providing the high-concentration second region 3b and the high-concentration fourth region 4b, it is possible to reduce the spreading speed of the depletion layer DL during the turn-off operation. As a result, the feedback capacitance Crss at the time of complete depletion can be gently changed. As indicated by broken lines in FIG. 10, in the embodiment, it is indicated that the change in Vds per unit time, that is, dVds/dt, becomes gentle in a final stage at the turn-off time, and the generated surge does not exceed the V(BR)DSS. That is, the silicon carbide semiconductor device 30 according to the embodiment can prevent the surge due to the jump in Vds.

More specifically, the depletion layer spreads from an interface between the first region 3a and the third region 4a both having a low concentration toward the second region 3b and the fourth region 4b both having a high concentration. Therefore, for example, when the depletion layer reaches the second region 3b and the fourth region 4b in the final stage at the turn-off time, the concentration changes from the first concentration to the second concentration and from the third concentration to the fourth concentration. That is, since the impurity concentrations become high, the depletion layer is less likely to extend in a lateral direction. Therefore, as compared with the semiconductor device according to the comparative example, a change in capacitance becomes gentle, and the change in the drain-source voltage is prevented. Accordingly, as compared with the semiconductor device according to the comparative example, the silicon carbide semiconductor device 30 according to the embodiment can prevent breakdown of the silicon carbide semiconductor device 30 due to a surge voltage exceeding the drain-source breakdown voltage V(BR)DSS.

Here, for example, when silicon is used as a material of the semiconductor device, impurities diffuse between pillars during heat treatment after the ion implantation. Therefore, when compared under the same conditions as the profiles shown in FIGS. 7 and 8, the profile in a case of using silicon as the material has a shape in which the concentration gradually decreases with a concentration at a center of a pillar center portion as a vertex.

In contrast, the silicon carbide semiconductor device 30 according to the embodiment uses silicon carbide as a material. Since a diffusion coefficient of impurities in the silicon carbide is lower than a diffusion coefficient in the silicon, during an activation heat treatment, the n-type impurity and the p-type impurity remain in the first semiconductor pillar region 3 and the second semiconductor pillar region 4, respectively, and the diffusion becomes gentle. Therefore, in each of the first semiconductor pillar region 3 and the second semiconductor pillar region 4, as shown in FIGS. 7 and 8, a substantially stepwise concentration profile having different impurity concentrations can be easily formed. That is, according to the embodiment, for example, the impurity concentrations and the region widths W of the high-concentration second region 3b and the high-concentration fourth region 4b can be precisely controlled. Accordingly, the silicon carbide semiconductor device 30 can easily and precisely control the spread of the depletion layer, and can control the change in capacitance at the turn-off time and the generation of Vds surge accompanying the change in capacitance.

Further, in the embodiment as described above, the first concentration and the third concentration are substantially the same concentration, and the second concentration and the fourth concentration are substantially the same concentration. Accordingly, the silicon carbide semiconductor device 30 can maintain a charge balance between the first semiconductor pillar region 3 and the second semiconductor pillar region 4.

In the silicon carbide semiconductor device 30, an n-type buffer layer may be provided on the semiconductor layer 2. By providing the n-type buffer layer, it is possible to prevent a region where the ion implantation is directly performed on the semiconductor layer 2 from being generated.

Further, the above embodiment describes that both the first semiconductor pillar region 3 and the second semiconductor pillar region 4 have regions having different impurity concentrations, but the invention is not limited thereto. For example, the first semiconductor pillar region 3 may have different impurity concentrations as in the first regions 3a and the second region 3b described above, and the second semiconductor pillar region 4 may have a uniform impurity concentration at the impurity concentration of the third regions 4a.

A super junction structure including the substrate 1, the semiconductor layer 2, the first semiconductor pillar region 3, and the second semiconductor pillar region 4 can be applied not only to a planar gate SJ-MOSFET type semiconductor device but also to other types of semiconductor devices. Hereinafter, cases where the super junction structure according to the embodiment is applied to other types of semiconductor devices will be described.

Second Embodiment

A second embodiment describes a trench gate SJ-MOSFET type silicon carbide semiconductor device. Hereinafter, configurations different from those of the first embodiment will be described. The same configurations as those of the first embodiment are denoted by the same reference numerals, and detailed descriptions thereof will be omitted.

Figure 11:
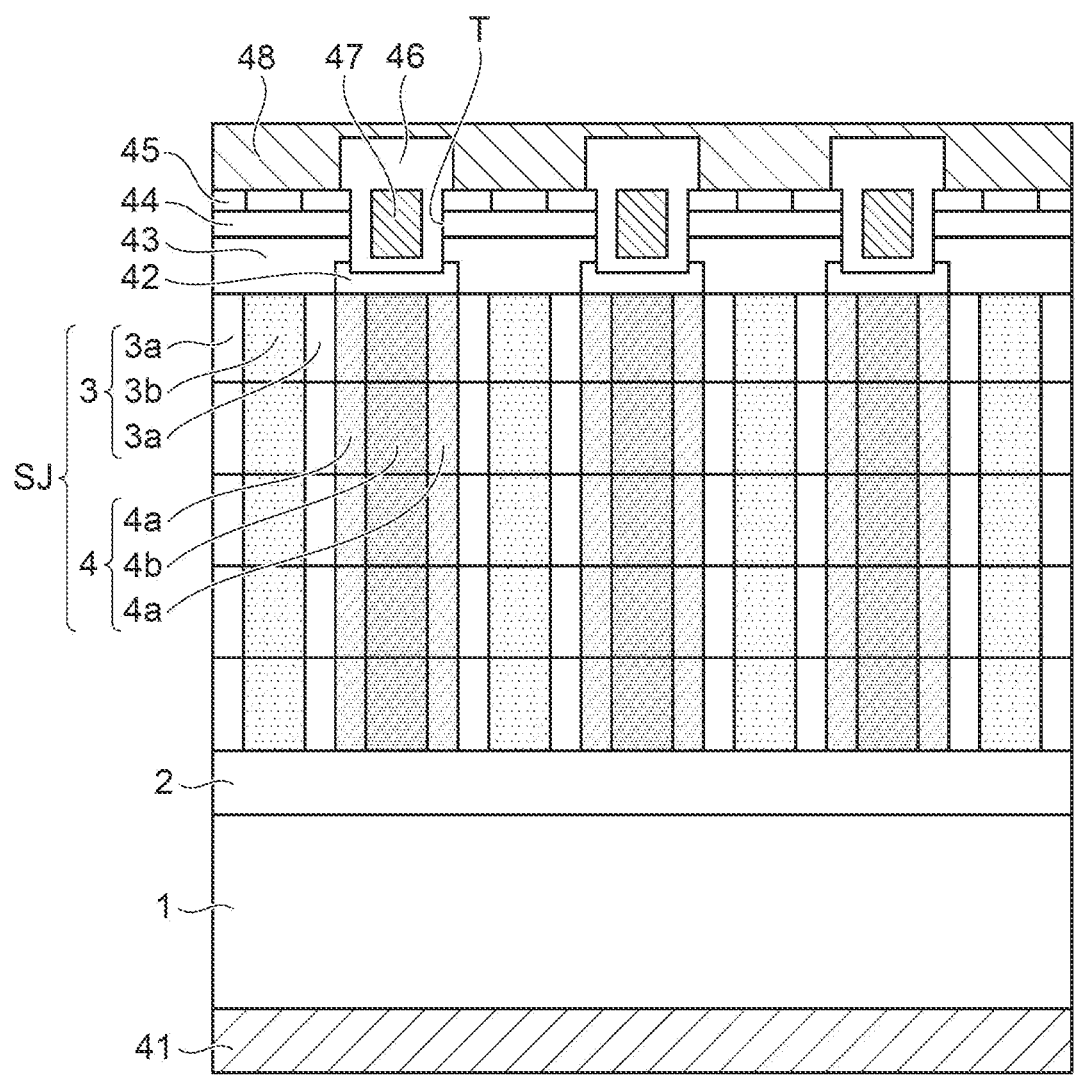
FIG. 11 is a schematic cross-sectional view showing an example of a structure of a silicon carbide semiconductor device in the second embodiment.
Figure 12:
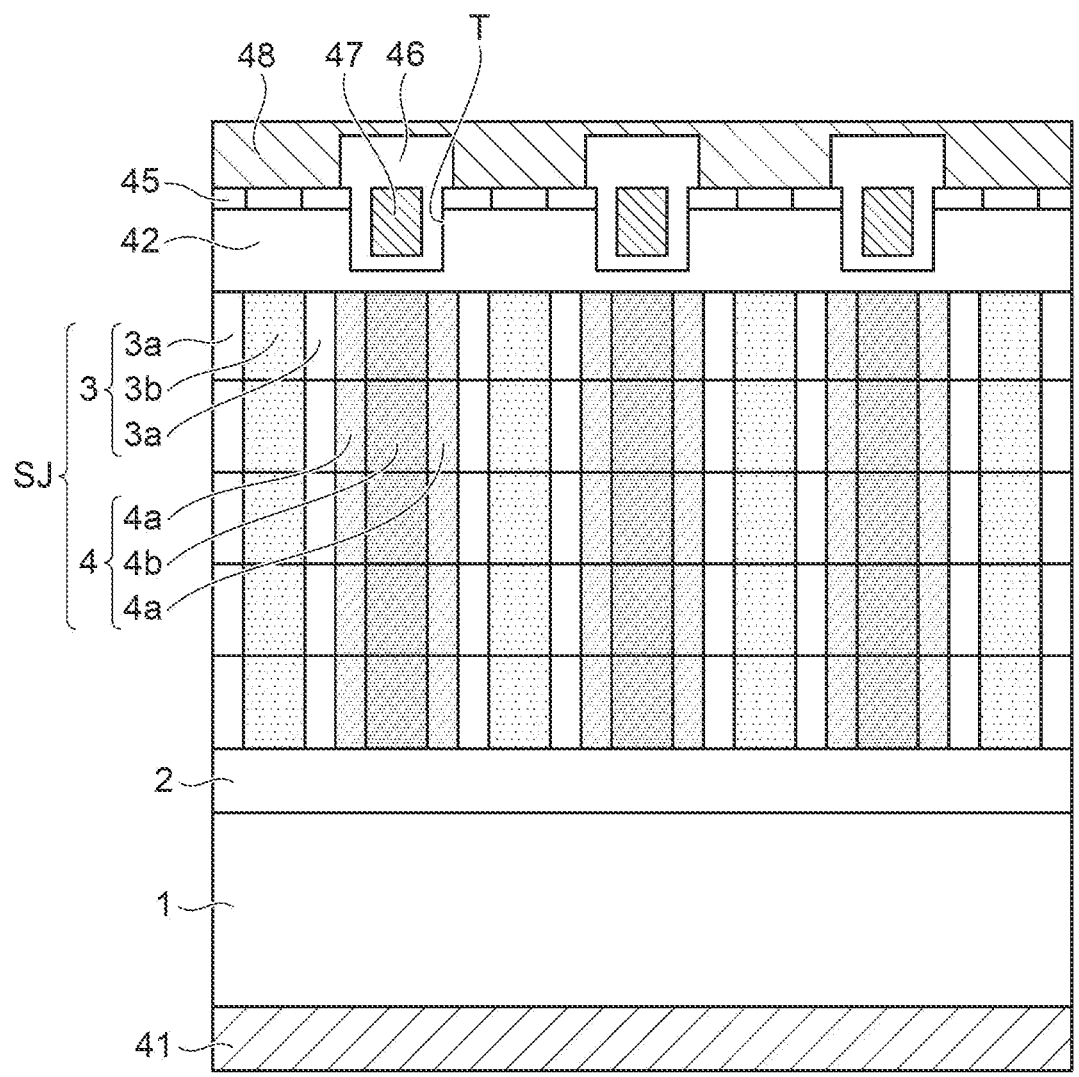
FIG. 12 is a schematic cross-sectional view showing an example of a structure of a silicon carbide semiconductor device in the third embodiment.

FIG. 11 is a schematic cross-sectional view showing an example of a structure of a silicon carbide semiconductor device 40 according to the embodiment. FIG. 12 is another schematic cross-sectional view showing an example of the structure of the silicon carbide semiconductor device 40.

As shown in FIG. 11, a drain electrode 41 is formed on a lower side of the substrate 1. A p-type semiconductor region 42 is formed on an upper side of the second semiconductor pillar region 4 and on a lower side of a trench T. An n-type semiconductor region 43 is formed on an upper side of the first semiconductor pillar region 3.

A p base 44 is formed on an upper side of the n-type semiconductor region 43. A source layer 45 is formed on an upper side surface of the p base 44. The trench T penetrates the source layer 45, the p base 44, and the n-type semiconductor region 43 and is embedded in the p-type semiconductor region 42. A gate electrode 47 is formed in the trench T through an insulating film 46. A portion of the insulating film 46 penetrating the source layer 45, the p base 44, and the n-type semiconductor region 43 is made of silicon dioxide (SiO$_2$) having an interface subjected to NO oxynitride treatment including nitrogen. The insulating film 46 on an upper side of the source layer 45 is made of silicon dioxide. A source electrode 48 is formed on upper sides of the source layer 45 and the trench T.

In the schematic cross-sectional view shown in FIG. 11, the p-type semiconductor region 42 is not connected to the p base 44, but in the schematic cross-sectional view shown in FIG. 12, the p-type semiconductor region 42 is connected to the p base 44.

Such a trench gate SJ-MOSFET type silicon carbide semiconductor device 40 can also achieve the same effects as those in the first embodiment.

Variations of the trench gate SJ-MOSFET type silicon carbide semiconductor device will be described below with reference to FIGS. 13 to 19. Therefore, differences from the silicon carbide semiconductor device 40 according to the second embodiment will be described in detail. The same configurations as those of the first and second embodiments are denoted by the same reference numerals, and detailed descriptions thereof will be omitted.

Third Embodiment

Figure 13:
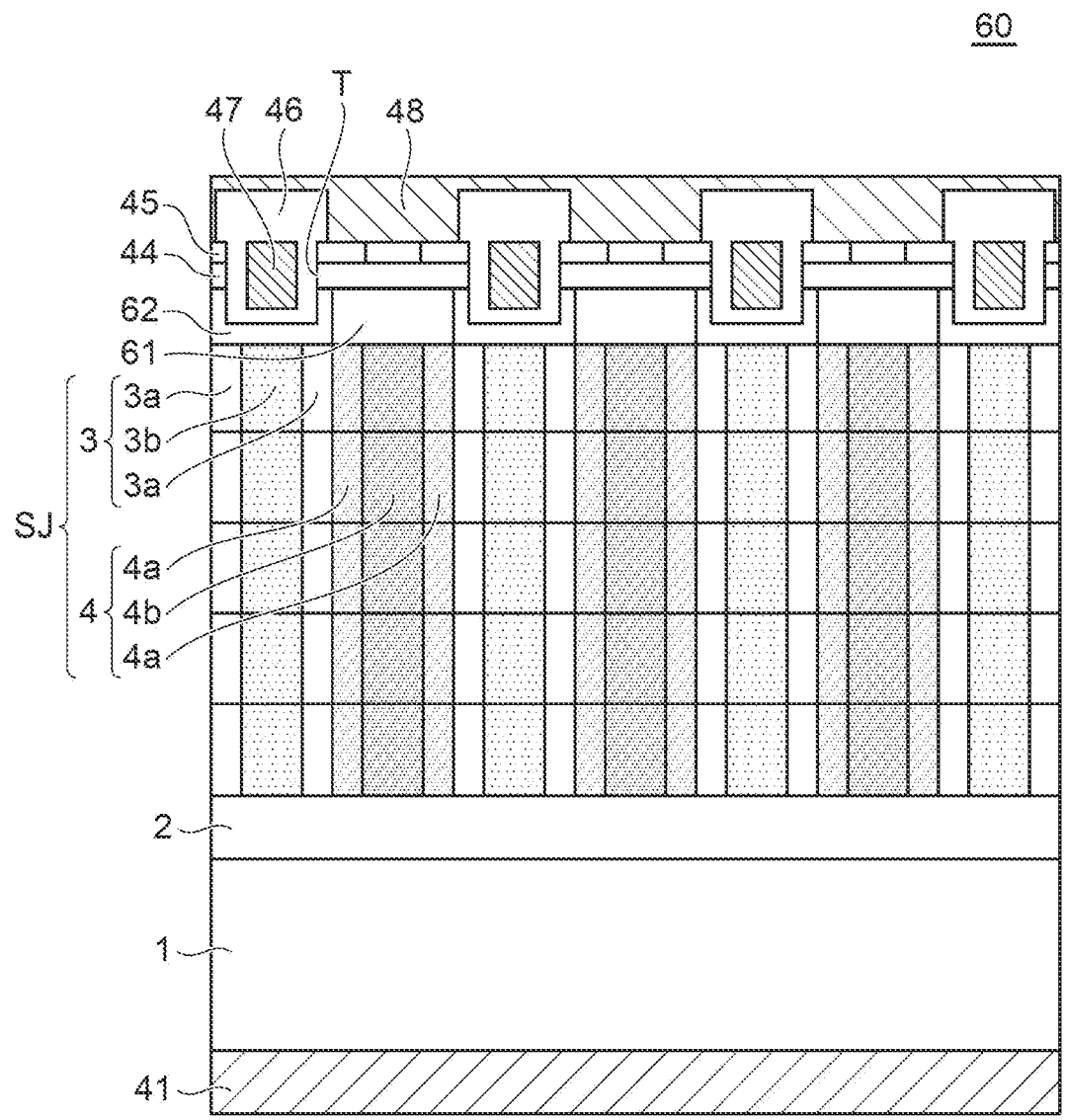
FIG. 13 is a schematic cross-sectional view showing an example of a structure of a silicon carbide semiconductor device in the fourth embodiment.

FIG. 13 is a schematic cross-sectional view showing an example of a structure of a silicon carbide semiconductor device 60 according to the embodiment.

As shown in FIG. 13, as compared with the silicon carbide semiconductor device 40, the silicon carbide semiconductor device 60 is different in that a p-type semiconductor region 61 is formed on an upper side of the second semiconductor pillar region 4 of the super-junction layer SJ and on a lower side of the p base 44. The trench T is embedded in an n-type semiconductor region 62 formed on an upper side of the first semiconductor pillar region 3. Such a trench gate SJ-MOSFET type silicon carbide semiconductor device 60 can also achieve the same effects as those of the second embodiment.

Fourth Embodiment

Figure 14:
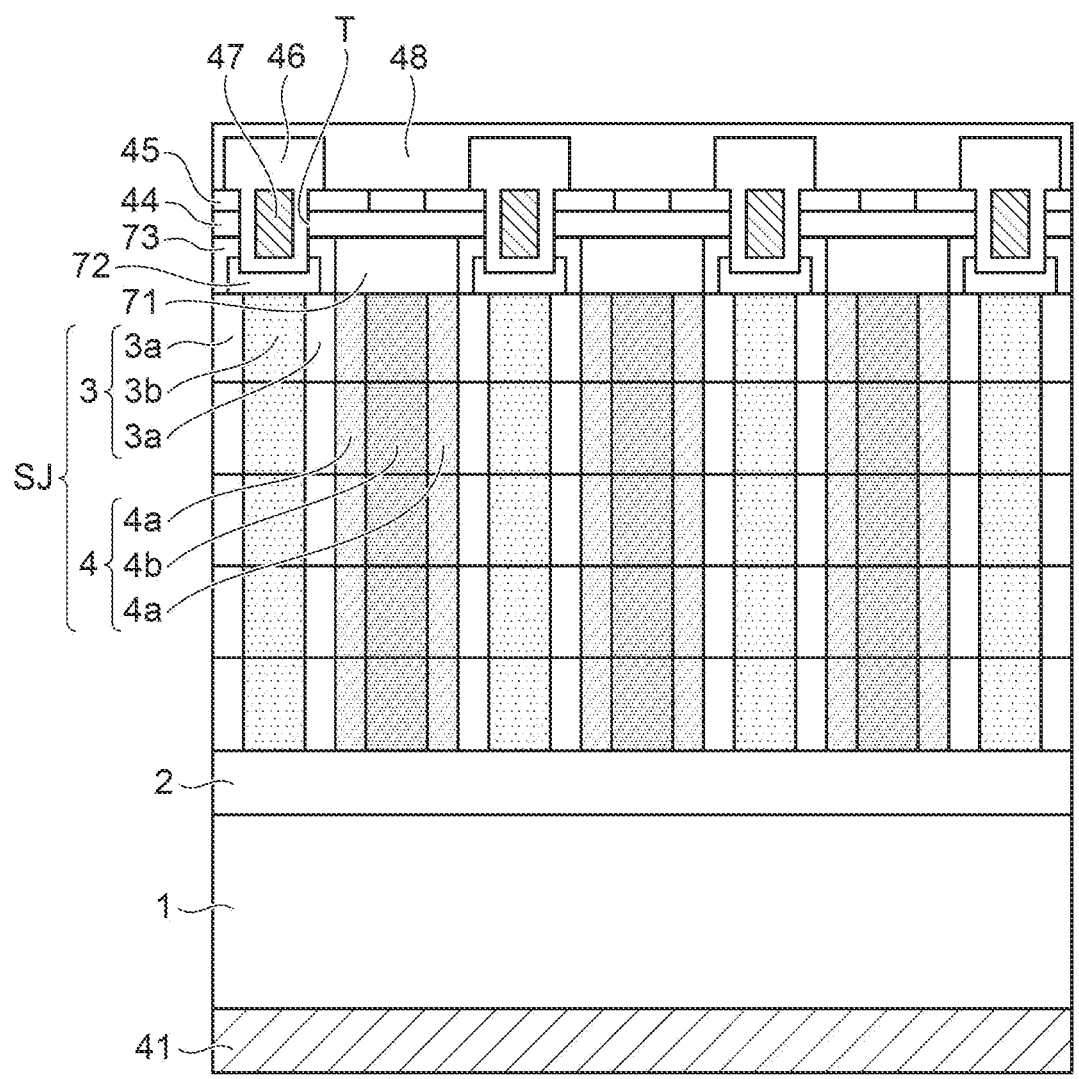
FIG. 14 is a schematic cross-sectional view showing an example of a structure of a silicon carbide semiconductor device in the fifth embodiment.
Figure 15:
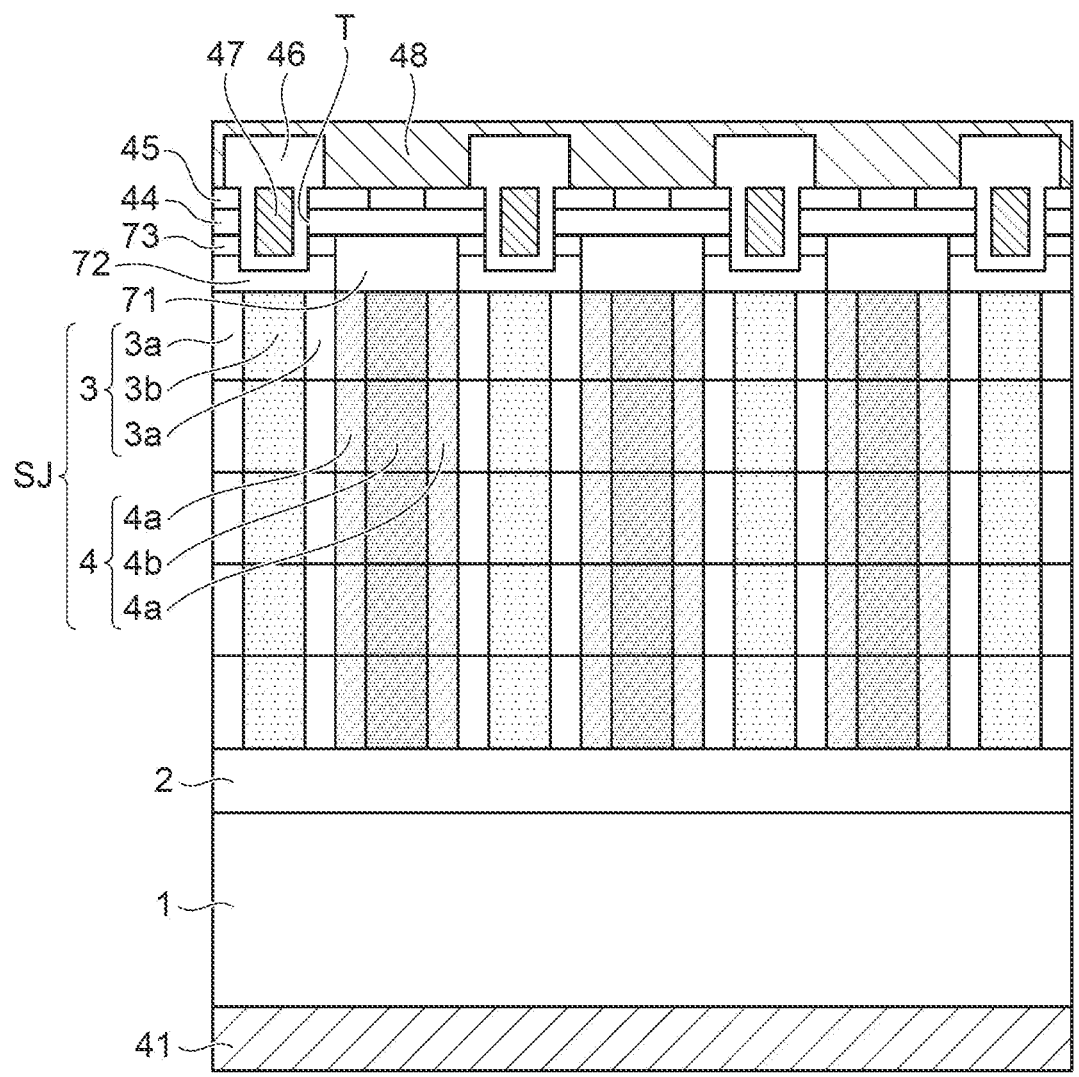
FIG. 15 is a schematic cross-sectional view showing an example of a structure of a silicon carbide semiconductor device in the sixth embodiment.

FIG. 14 is a schematic cross-sectional view showing an example of a structure of a silicon carbide semiconductor device 70 according to the embodiment. FIG. 15 is another schematic cross-sectional view showing an example of the structure of the silicon carbide semiconductor device 70.

As shown in FIG. 14, as compared with the silicon carbide semiconductor device 40, the silicon carbide semiconductor device 70 is different in that a p-type semiconductor region 71 is formed on an upper side of the second semiconductor pillar region 4 of the super-junction layer SJ and on a lower side of the p base 44. The silicon carbide semiconductor device 70 is also different in that a p-type semiconductor region 72 is formed on an upper side of a portion including parts of the first regions 3a and the second region 3b and on a lower side of the insulating film 46. Further, an n-type semiconductor region 73 is disposed on an end portion of each first region 3a, on the p-type semiconductor region 72, along a wall surface of the p-type semiconductor region 72, and contiguous to the p-type semiconductor region 71. The trench T is formed such that a portion on the lower side of the insulating film 46 is embedded in the p-type semiconductor region 72.

In the schematic cross-sectional view shown in FIG. 14, the p-type semiconductor region 72 is not connected to the p base 44, but in the cross section shown in FIG. 15, the p-type semiconductor region 72 is connected to the p base 44.

Such a trench gate SJ-MOSFET type silicon carbide semiconductor device 70 can also achieve the same effects as those of the second embodiment.

In the trench gate SJ-MOSFET type silicon carbide semiconductor device, configurations and the number of the n-type semiconductor region and the p-type semiconductor region that are electrically connected to the super-junction layer SJ and the p base 44 can be appropriately adjusted.

Fifth Embodiment

Next, a PN (p-n) diode type silicon carbide semiconductor device 10 will be described. Hereinafter, configurations different from those of the first embodiment will be described. The same configurations as those of the first embodiment are denoted by the same reference numerals, and detailed descriptions thereof will be omitted.

Figure 16:
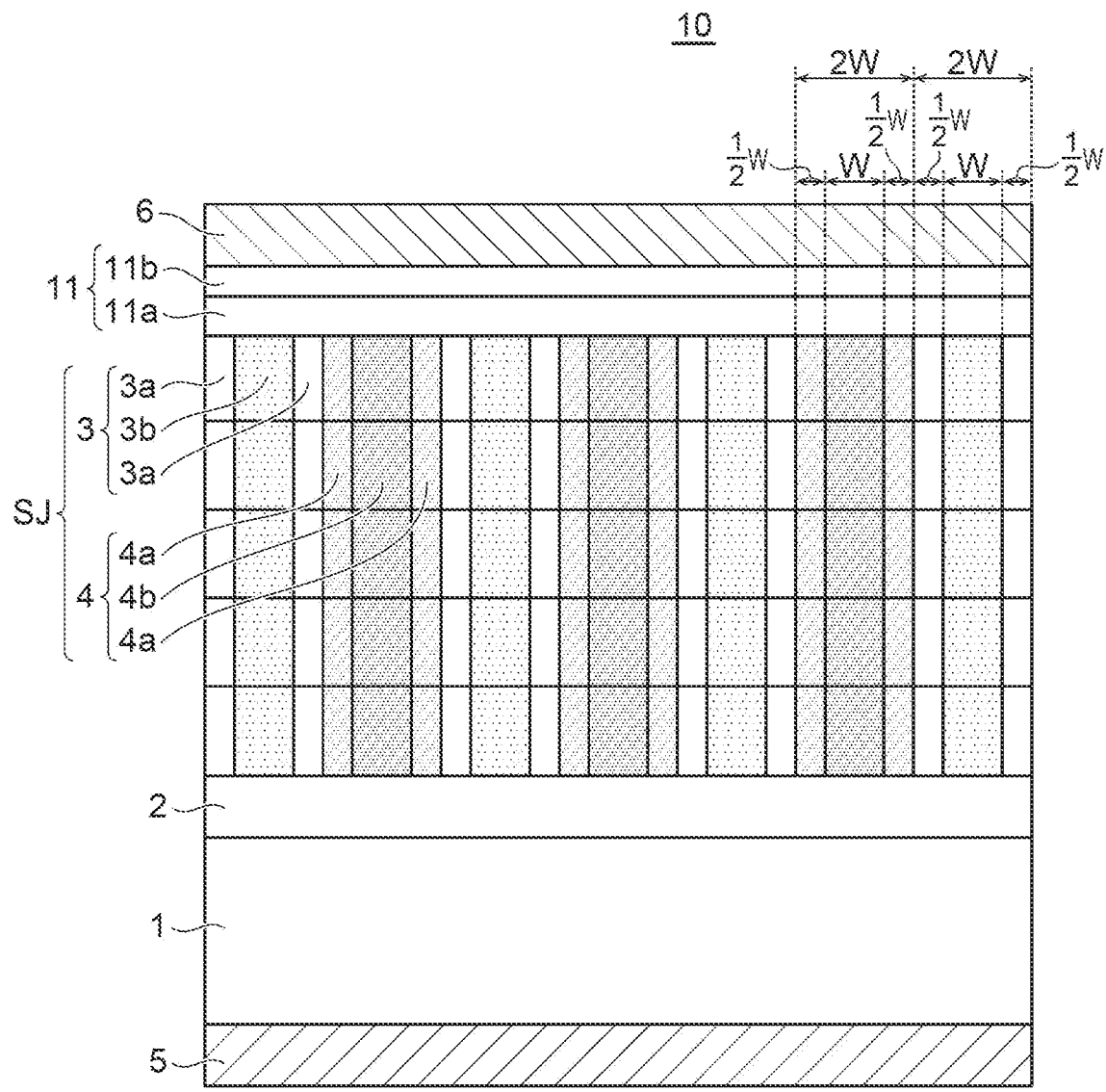
FIG. 16 is a schematic cross-sectional view showing an example of a structure of a silicon carbide semiconductor device in the seventh embodiment.

As shown in FIG. 16, the silicon carbide semiconductor device 10 includes the substrate 1, the semiconductor layer 2, the super-junction layer SJ, a p-type semiconductor layer 11, a cathode electrode 5, and an anode electrode 6. The p-type semiconductor layer 11 is provided between the super-junction layer SJ and the anode electrode 6. Since the super-junction layer SJ has the same structure as that of the silicon carbide semiconductor device 30, a behavior of a depletion layer of the super-junction layer SJ at the time of reverse bias is similar to that of the silicon carbide semiconductor device 30.

The cathode electrode 5 is provided on a face of the substrate 1 opposite to a face of the substrate 1 on which the semiconductor layer 2 is provided. The anode electrode 6 is provided above upper surfaces (faces opposite to the semiconductor layer 2 side) of the first semiconductor pillar region 3 and the second semiconductor pillar region 4 through the p-type semiconductor layer 11. The cathode electrode 5 and the anode electrode 6 are made of metal. In the embodiment, the p-type semiconductor layer 11 is made of silicon carbide and includes a first layer 11a and a second layer 11b. The first layer 11a is formed on an upper side surface of the super-junction layer SJ, and the second layer 11b is formed between the first layer 11a and the anode electrode 6.

The first layer 11a and the second layer 11b contain a p-type impurity, for example, aluminum. The first layer 11a is a p-type layer and has an impurity concentration of, for example, $1\times10^{18}/cm^3$. A thickness of the first layer 11a is, for example, 0.2 µm. The second layer 11b is a p-type layer and has an impurity concentration of, for example, $1\times10^{19}/cm^3$. A thickness of the second layer 11b is, for example, 0.2 µm. The PN diode type silicon carbide semiconductor device 10 having such a configuration can also achieve the same effects as those in the first embodiment.

Sixth Embodiment

Next, a Schottky barrier diode (SBD) type silicon carbide semiconductor device 20 will be described. Hereinafter, configurations different from those of the first embodiment will be described. The same components as those of the first and fifth embodiments are denoted by the same reference numerals, and detailed descriptions thereof will be omitted.

Figure 17:
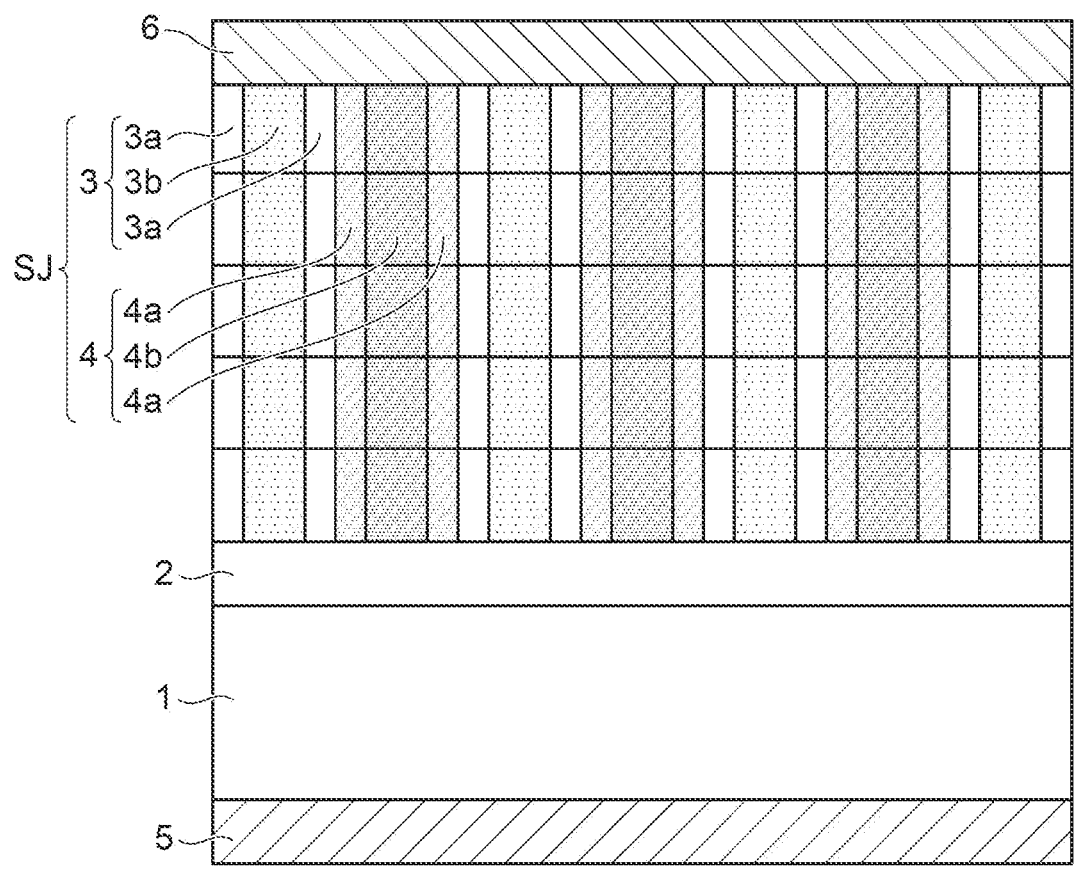
FIG. 17 is a schematic cross-sectional view showing an example of a structure of a silicon carbide semiconductor device in the eighth embodiment.

FIG. 17 is a schematic cross-sectional view showing an example of a structure of the silicon carbide semiconductor device 20 according to the embodiment.

As shown in FIG. 17, as compared with the silicon carbide semiconductor device 10, the silicon carbide semiconductor device 20 is different in that the super-junction layer SJ is connected to the anode electrode 6, and the p-type semiconductor layer 11 is not formed. The anode electrode 6 forms a Schottky junction with the first semiconductor pillar region 3 and forms an ohmic contact with the second semiconductor pillar region 4. Since the super-junction layer SJ has the same structure as that of the silicon carbide semiconductor device 30, a behavior of a depletion layer of the super-junction layer SJ at the time of reverse bias is similar to that of the silicon carbide semiconductor device 30. Thus, the Schottky barrier diode type silicon carbide semiconductor device 20 can also achieve the same effects as those in the first embodiment.

(Simulation Results)

Next, simulation results of a change, which occurs when an applied voltage increases in the super-junction layer SJ used in each of the silicon carbide semiconductor devices described above, will be described. The simulation uses the structure of the SBD-type silicon carbide semiconductor device 20 described in the sixth embodiment. Since anode-cathode capacitance C of the silicon carbide semiconductor device 20 corresponds to output capacitance Coss of the MOSFET-type silicon carbide semiconductor devices 30, 40, 60, and 70 described above, the output capacitance Coss and the feedback capacitance Crss correlate with each other. Therefore, a behavior of Crss of each MOSFET-type silicon carbide semiconductor device can also be examined by simulating capacitance characteristics of the structure of the SBD-type silicon carbide semiconductor device 20. The output capacitance Coss is obtained by adding drain-source capacitance Cds to the gate-drain capacitance Cgd.

Figure 18A:
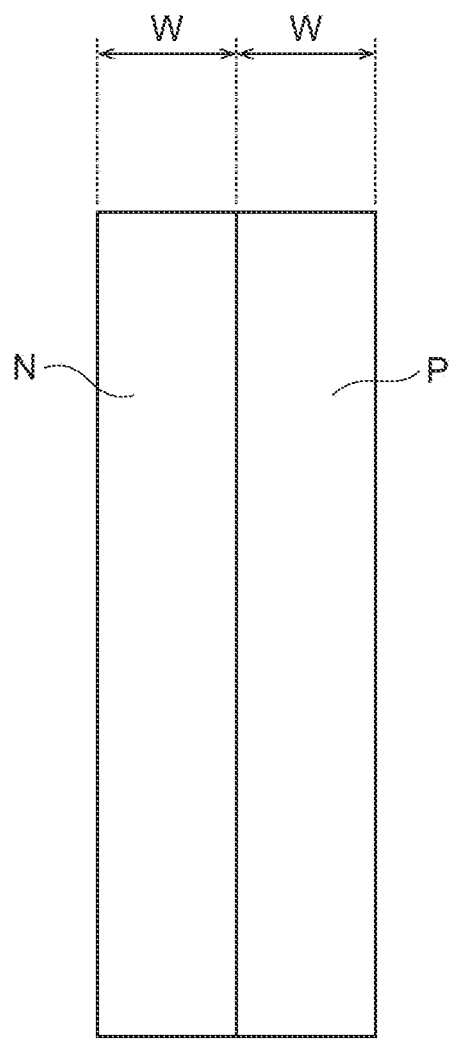
FIGS. 18A and 18B are diagrams for explaining simulation conditions.
Figure 18B:
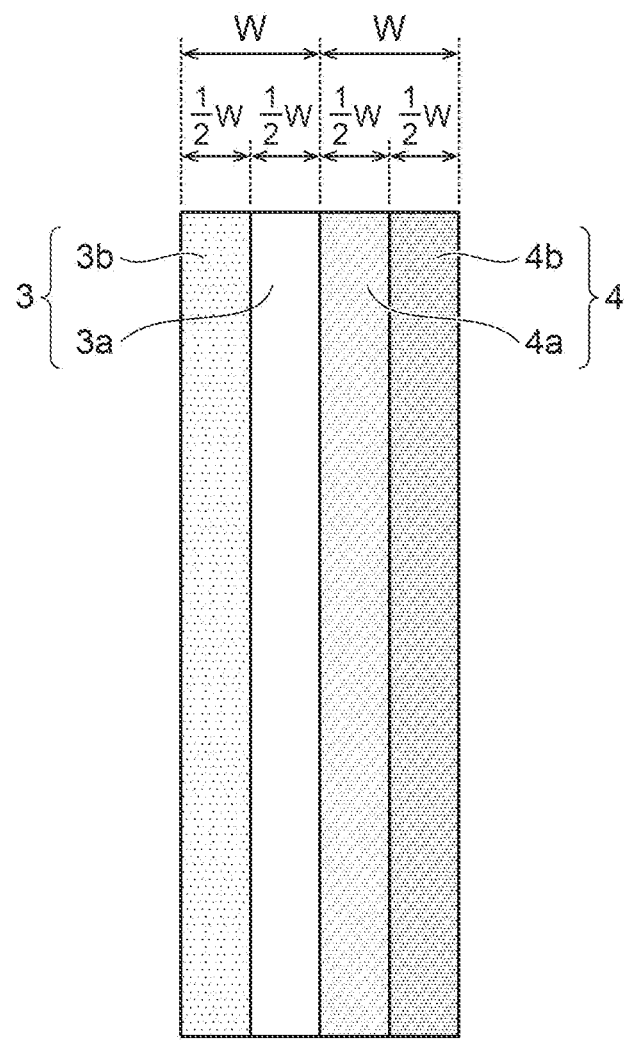

FIG. 18A shows simulation conditions of a super junction structure of a silicon carbide semiconductor device as a comparative example, and FIG. 18B shows simulation conditions of the super junction structure of the embodiment.

As shown in FIG. 18A, the super junction structure of the comparative example includes a first semiconductor pillar region N and a second semiconductor pillar region P. The first semiconductor pillar region N and the second semiconductor pillar region P have the same width W, and have an impurity concentration at the same concentration D. That is, FIG. 18A shows a case where the first semiconductor pillar region N and the second semiconductor pillar region P have a uniform impurity concentration.

As shown in FIG. 18B, the super junction structure according to the embodiment includes a part from a central portion to an end portion of the first semiconductor pillar region 3 and a part from a central portion to an end portion of the second semiconductor pillar region 4 contiguous to the end portion of the first semiconductor pillar region 3. The first semiconductor pillar region 3 and the second semiconductor pillar region 4 both have a width W, and widths of the first region 3a, the second region 3b, the third region 4a, and the fourth region 4b are half the width W. Impurity concentrations of the second region 3b and the fourth region 4b are 1.5 times the concentration D of the comparative example. A simulation of two patterns of impurity concentrations of the first region 3a and the third region 4a is performed, that is, a case of half the concentration D and a case of the concentration D.

Figures 19A, 19B:
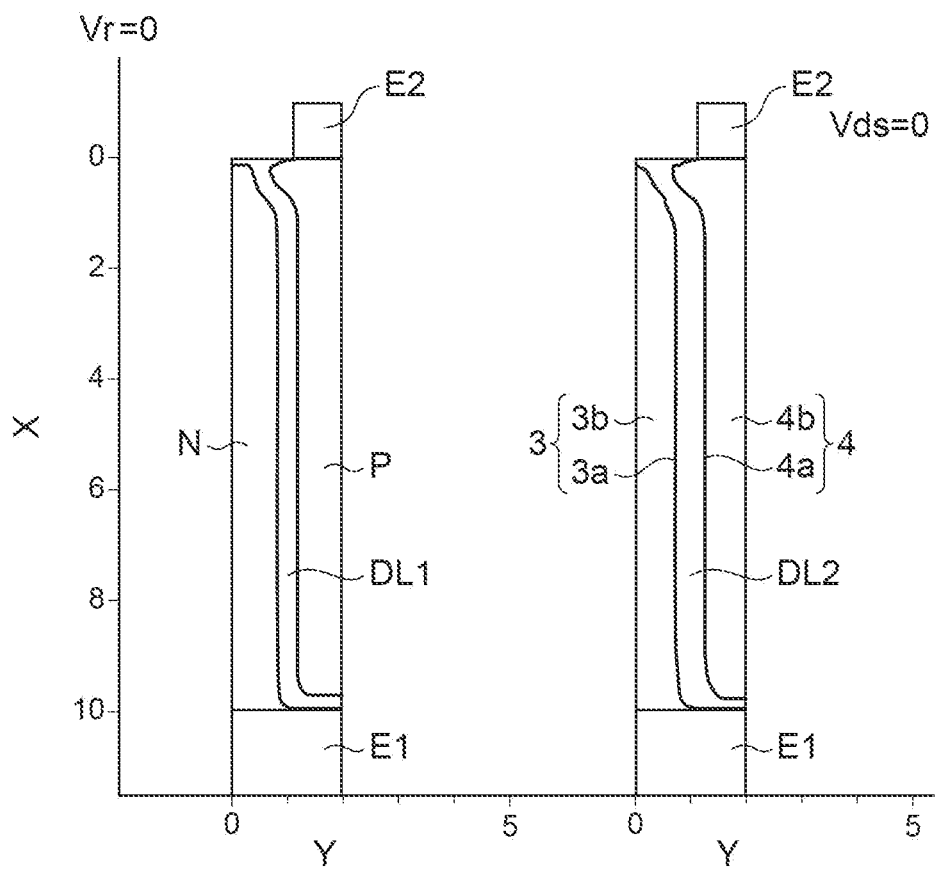
FIGS. 19A and 19B are diagrams showing an example of a simulation result.

FIGS. 19A and 19B are diagrams showing an example of a simulation result when a reverse voltage Vr applied to a first electrode (cathode electrode) E1 and a second electrode (anode electrode) E2 is 0 V at the time of reverse bias.

As shown in FIGS. 19A and 19B, the simulation is performed with a so-called Schottky structure in which the first electrode E1 is disposed on lower sides of the first semiconductor pillar region N, the second semiconductor pillar region P, the first semiconductor pillar region 3, and the second semiconductor pillar region 4, and the second electrode E2 is disposed on upper sides of the second semiconductor pillar region P and the second semiconductor pillar region 4. A temperature used for simulation is 25° C.

When a voltage Vds is 0 V, a depletion layer DL1 shown in FIG. 19A and a depletion layer DL2 shown in FIG. 19B are substantially the same.

Figure 20:
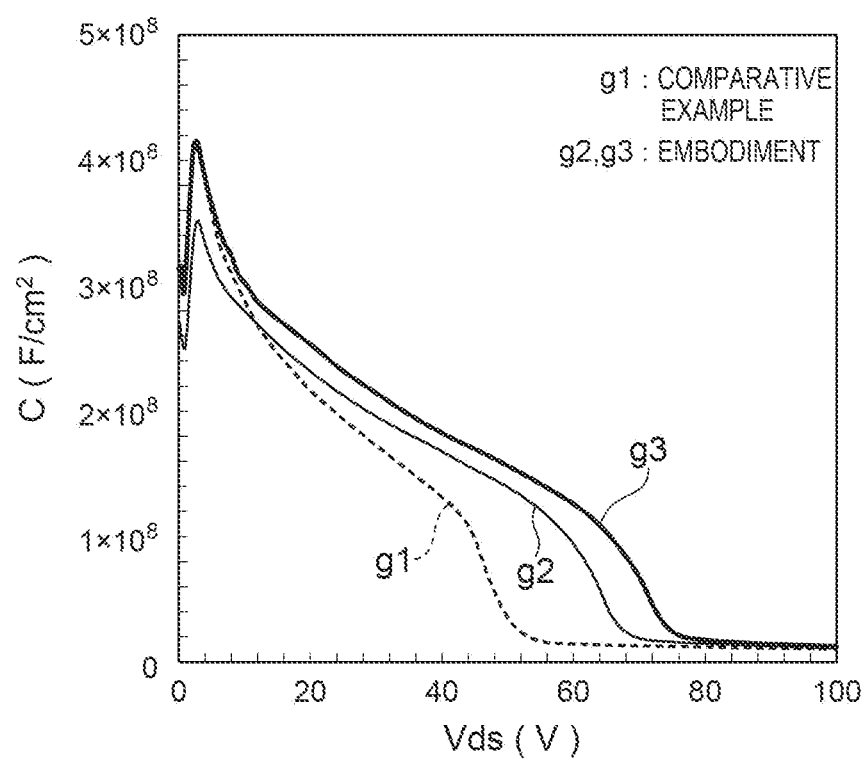
FIG. 20 is a diagram showing an example of a simulation result.
Figures 21A, 21B, 21C, 21D:
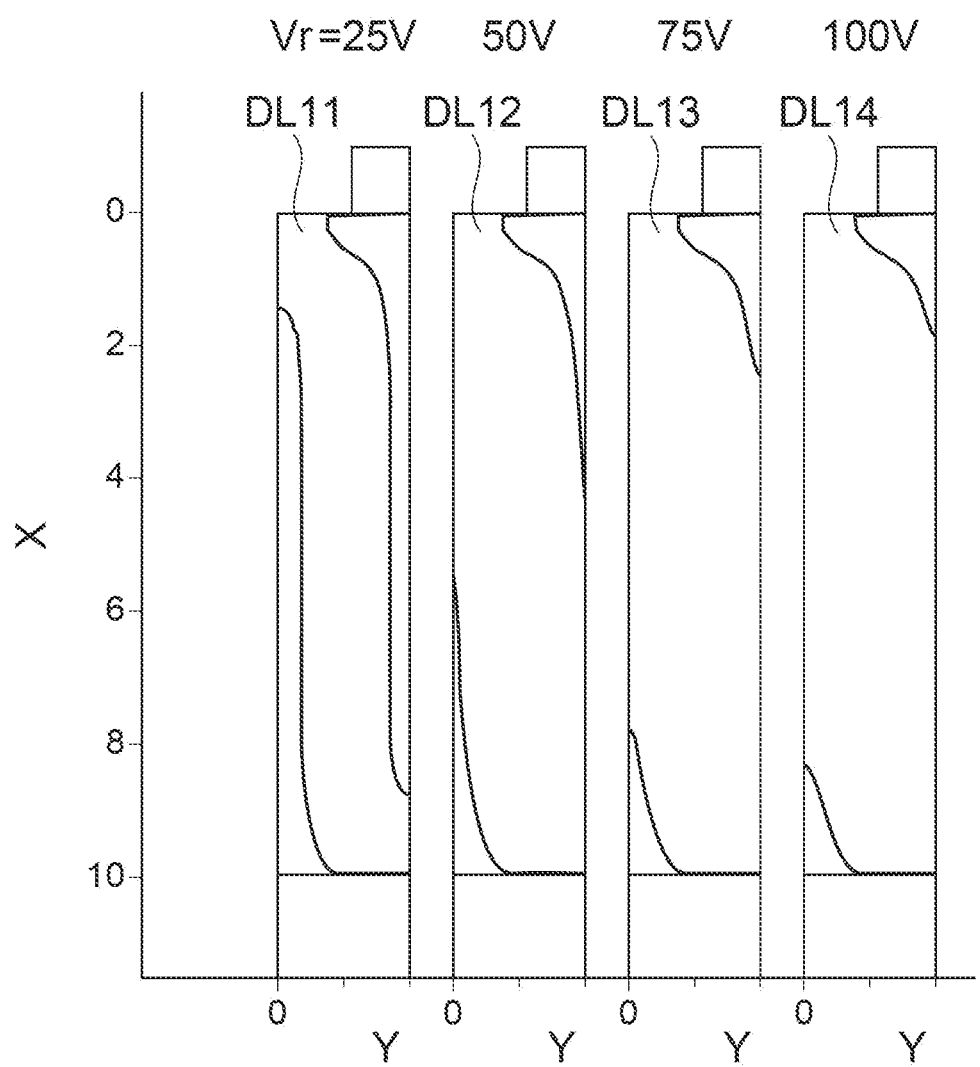
FIGS. 21A to 21D are diagrams showing an example of a simulation result.
Figures 22A, 22B, 22C, 22D:
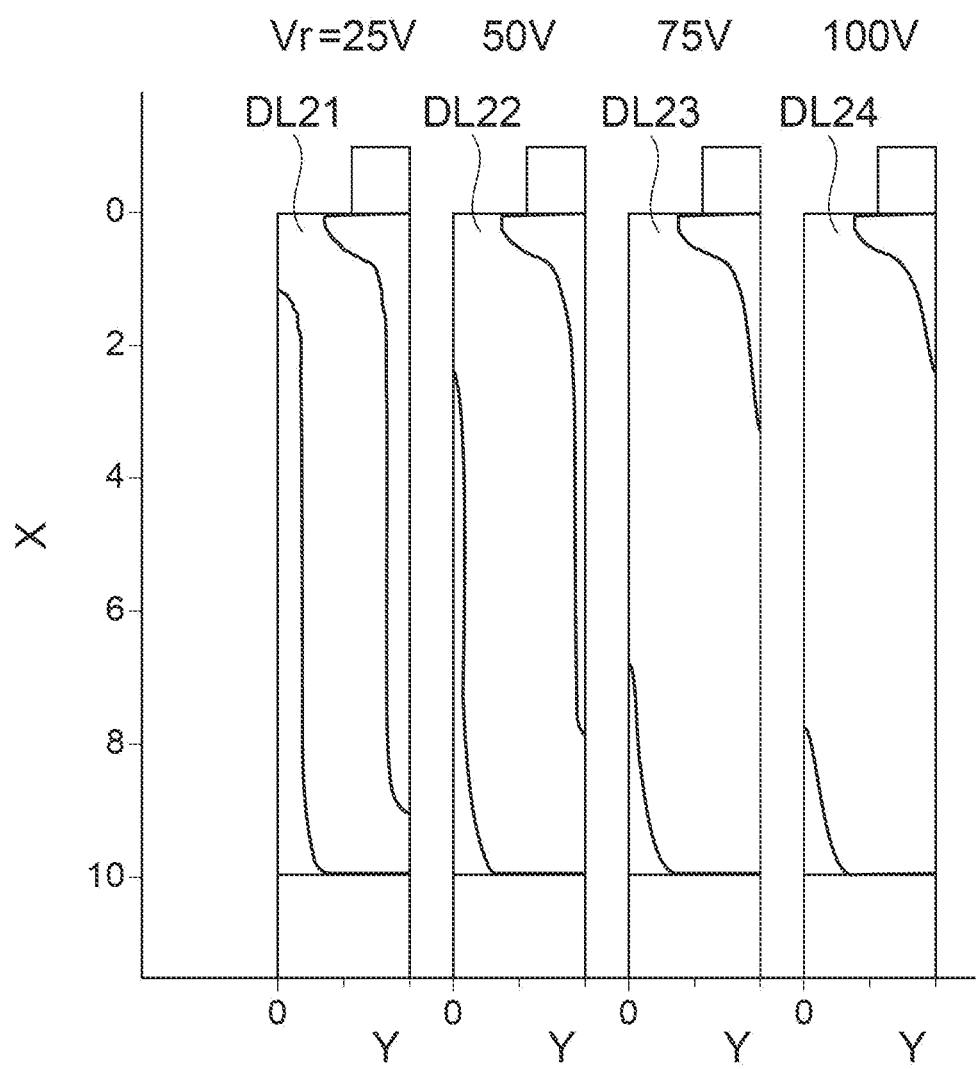
FIGS. 22A to 22D are diagrams showing an example of a simulation result.
Figures 23A, 23B, 23C, 23D:
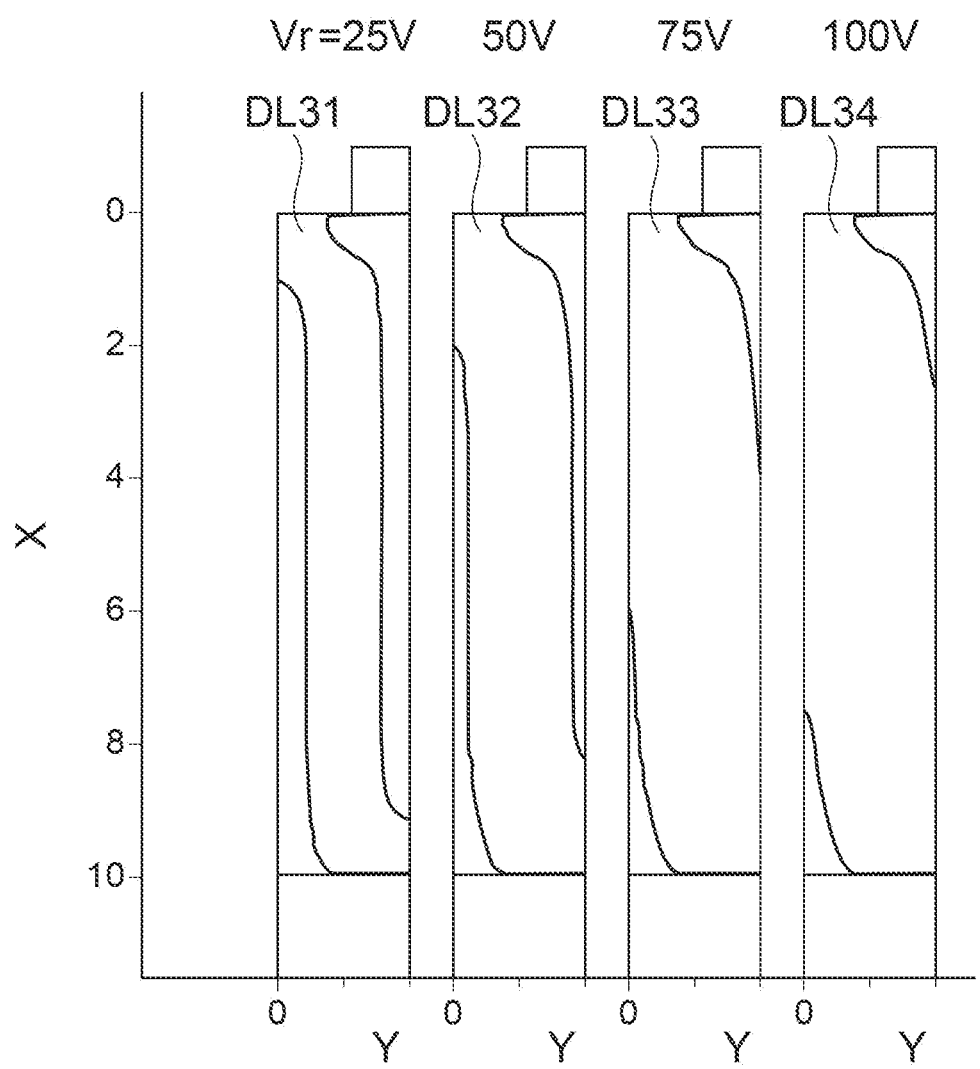
FIGS. 23A to 23D are diagrams showing an example of a simulation result.

FIG. 20 is a diagram showing an example of a simulation result of a change in capacitance when the voltage Vds is increased from 0 V.

In FIG. 20, a graph g1 is a simulation result of the super junction structure of the comparative example shown in FIG. 18A, and graphs g2 and g3 are simulation results of the super junction structure of the embodiment shown in FIG. 18B. The graph g2 shows a case where the concentration of the first region 3a and the third region 4a is half the concentration D, and the graph g3 shows a case where the concentration of the first region 3a and the third region 4a is the concentration D.

The graph g2 and the graph g3 show gentler changes in the capacitance than the graph g1. Accordingly, it can be seen that a steep change of a surge voltage also becomes gentle. Further, the graph g3 shows a gentler change in the capacitance than the graph g2. It indicates that the change in the capacitance is gentle when concentration differences between the second region 3b and the fourth region 4b and between the first region 3a and the third region 4a are smaller.

FIGS. 21A to 23D are diagrams showing examples of simulation results of changes in a depletion layer when the reverse voltage Vr is increased.

FIGS. 21A to 21D are diagrams showing examples of simulation results of changes in a depletion layer of the super junction structure as the comparative example shown in FIG. 18A. FIGS. 21A to 21D show cases where the reverse voltage Vr is 25 V, 50 V, 75 V, and 100 V, respectively. Depletion layers DL11 to DL14 correspond to the voltages 25 V, 50 V, 75 V, and 100 V, respectively.

FIGS. 22A to 22D are diagrams showing examples of simulation results of changes in a depletion layer of the super junction structure when the concentration of the first region 3a and the third region 4a is half the concentration D. FIGS. 22A to 22D show cases where the reverse voltage Vr is 25 V, 50 V, 75 V, and 100 V, respectively. Depletion layers DL21 to DL24 correspond to the voltages 25 V, 50 V, 75 V, and 100 V, respectively.

FIGS. 23A to 23D are diagrams showing examples of simulation results of changes in a depletion layer of the super junction structure when the concentration of the first region 3a and the third region 4a is the concentration D. FIGS. 23A to 23D show cases where the voltage Vds is 25 V, 50 V, 75 V, and 100 V, respectively. Depletion layers DL31 to DL34 correspond to the voltages 25 V, 50 V, 75 V, and 100 V, respectively.

Referring to FIGS. 21A to 23D, compared to the super junction structure of the comparative example, in the super junction structure of the embodiment, the depletion layer spreads gentler in a final stage of depletion. The changes in the depletion layers DL31 to DL34 shown in FIGS. 23A to 23D are gentler than the changes in the depletion layers DL21 to DL24 shown in FIGS. 22A to 22D.

Therefore, it can be seen that, by having the super junction structure of the embodiment, the change of the depletion layer can be made gentler at the turn-off time, and the surge voltage exceeding the drain-source breakdown voltage V(BR)DSS can be reduced. Accordingly, it can be seen that the silicon carbide semiconductor devices according to the above embodiments can prevent breakdown of the silicon carbide semiconductor devices due to the surge voltage exceeding the drain-source breakdown voltage V(BR)DSS by forming regions having a high impurity concentration in the central portions (the second region 3b and the fourth region 4b) of the first semiconductor pillar region 3 and the second semiconductor pillar region 4. In addition, it is shown that the change in the capacitance becomes gentler when the concentration differences between the second region 3b and the fourth region 4b and between the first region 3a and the third region 4a are smaller.

Other Embodiments

Next, another embodiment will be described.

Figure 24:
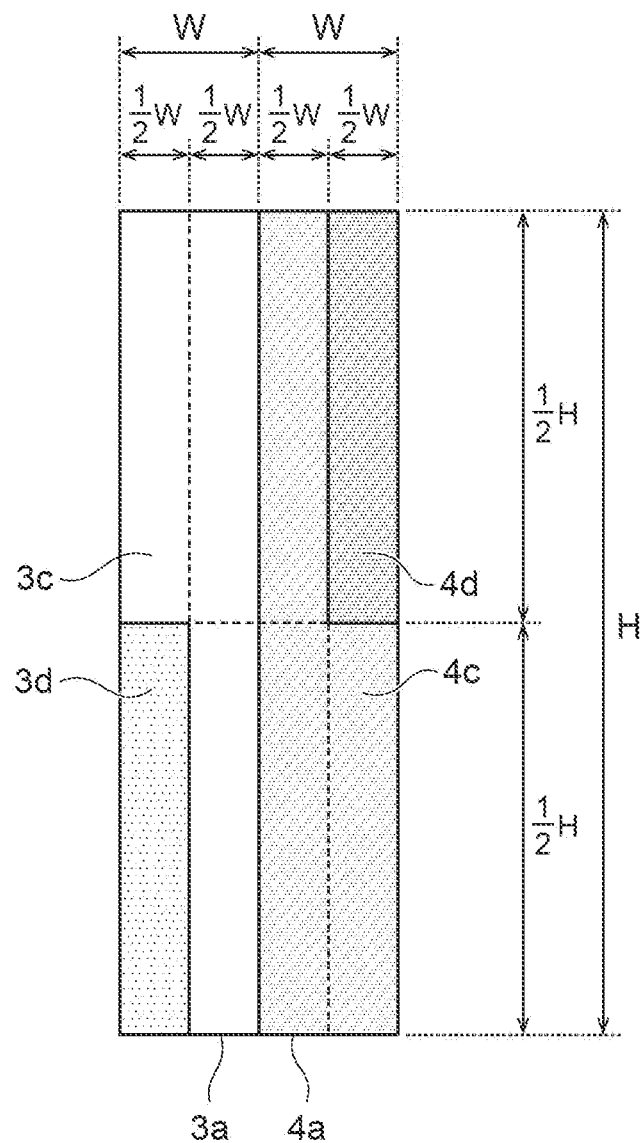
FIG. 24 is a diagram for explaining another simulation conditions.

The other embodiment has a different super junction structure. More specifically, as shown in FIG. 24, a region 3c corresponding to an upper portion of the second region 3b and a region 3d are formed instead of the second region 3b, and a region 4d and a region 4c are formed instead of the fourth region 4b. The region 3c is formed on an upper side of the drawing, the region 3d is formed on a lower side of the drawing, the region 4d is formed on the upper side of the drawing, and the region 4c is formed on the lower side of the drawing. In the embodiment, the regions 3c and 3d and the regions 4c and 4d have the same pillar depth. Impurity concentrations of the region 3c and the region 4c are the same as those of the first region 3a and the third region 4a, respectively, and are the concentration D. On the other hand, impurity concentrations of the region 3d and the region 4d are 1.5 times the concentration D of the first region 3a and the third region 4a, respectively. That is, regions having a high impurity concentration are formed in the region 4d on a lower left side and the region 3d on an upper right side of FIG. 24.

Simulation Results of Other Embodiments

Next, simulation results will be described.

As described in detail with reference to FIG. 24, the simulation is performed under the same conditions as the simulation conditions described above except that the regions having a high impurity concentration are different. Briefly speaking, the simulation conditions are different in that, in the second region 3b, only the lower half region 3d has the second concentration (1.5 times the concentration D) and the upper half region 3c has the first concentration (concentration D), and in the fourth region 4b, only the upper half region 4d has the fourth concentration (1.5 times the concentration D) and the lower half region 4c has the third concentration (concentration D).

Figures 25A, 25B:
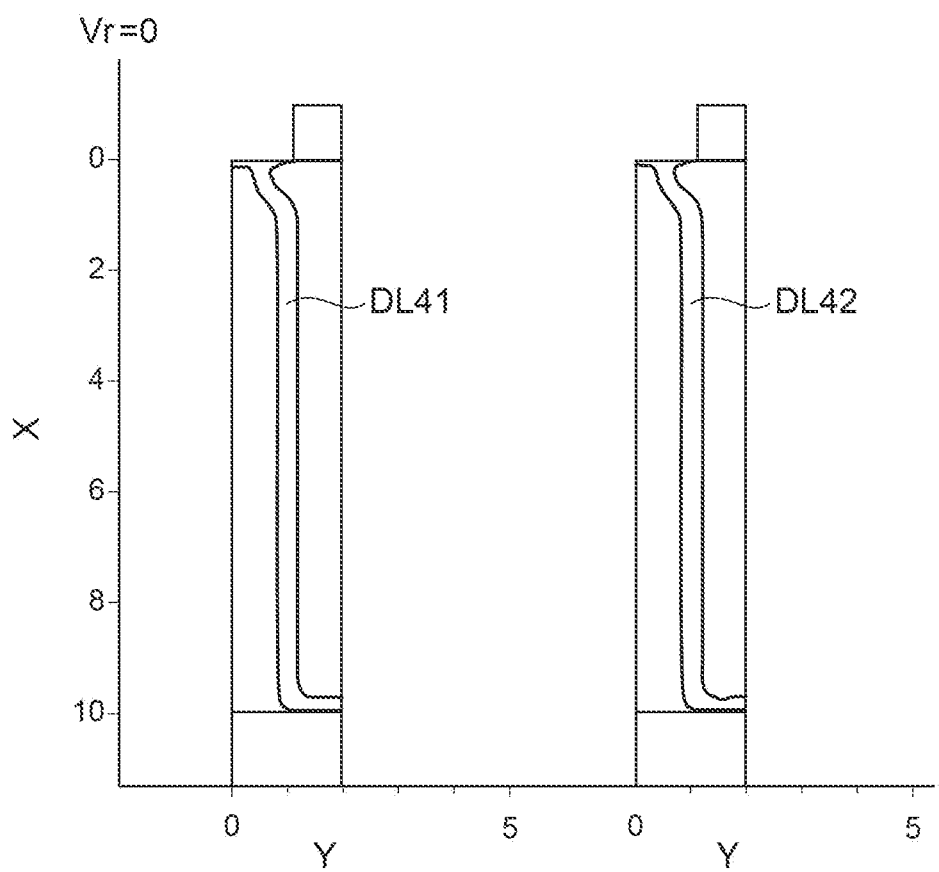
FIGS. 25A and 25B are diagrams showing an example of a simulation result.

FIGS. 25A and 25B are diagrams showing an example of a simulation result when the reverse voltage Vr applied to the first electrode E1 and the second electrode E2 is 0 V at the turn-off time.

When the reverse voltage Vr is 0 V, a depletion layer DL41 shown in FIG. 25A and a depletion layer DL42 shown in FIG. 25B are substantially the same.

Figure 26:
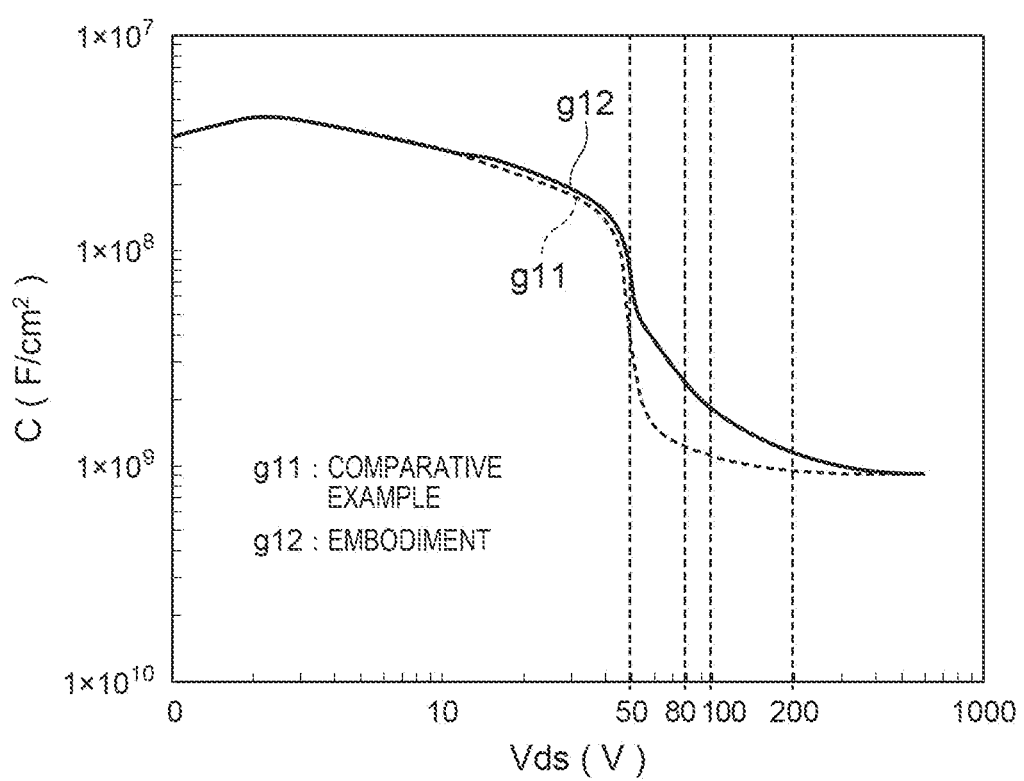
FIG. 26 is a diagram showing an example of a simulation result.
Figures 27A, 27B, 27C, 27D:
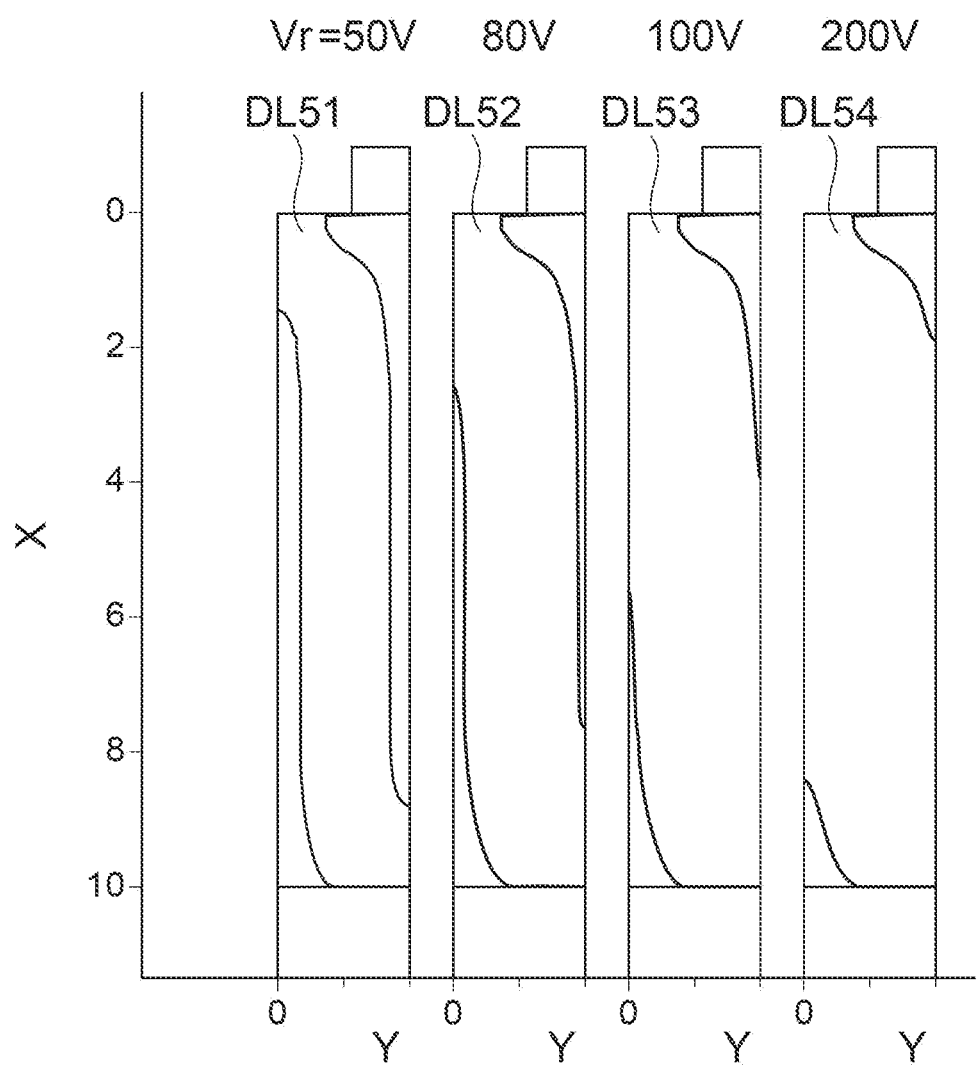
FIGS. 27A to 27D are diagrams showing an example of a simulation result.
Figures 28A, 28B, 28C, 28D:
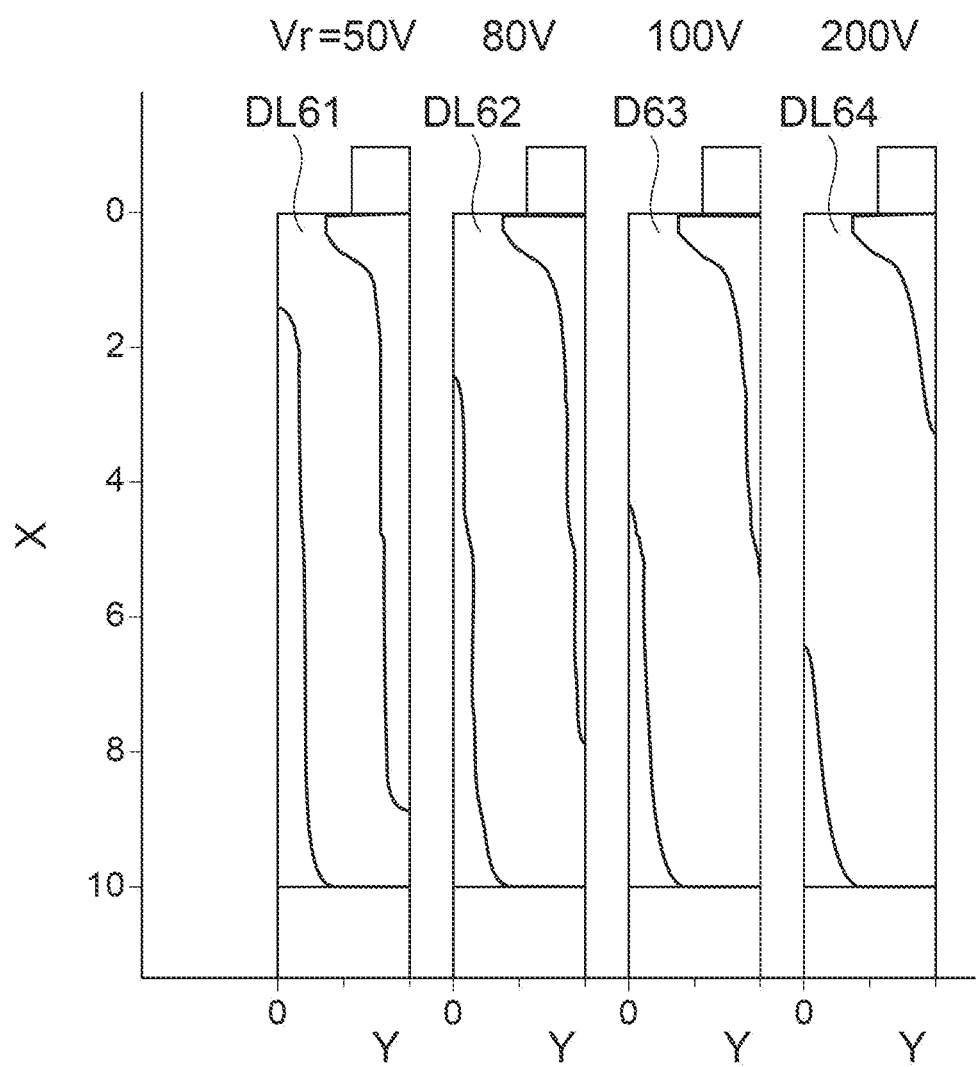
FIGS. 28A to 28D are diagrams showing an example of a simulation result.

FIG. 26 is a diagram showing an example of a simulation result of a change in capacitance when the reverse voltage Vr is increased. In the simulation, the capacitance is indicated on a logarithmic scale.

In FIG. 26, a graph g11 is a simulation result of a super junction structure of a comparative example shown in FIG. 18A, and a graph g12 is the simulation result of the super junction structure of the other embodiment shown in FIG. 24.

The graph g12 shows a gentler change in the capacitance than the graph g11. Accordingly, it indicates that magnitude of a surge voltage decreases.

FIGS. 27A to 27D are diagrams showing examples of simulation results of changes in a depletion layer of the super junction structure as the comparative example shown in FIG. 18A. FIGS. 27A to 27D show cases where the voltage Vds is 50 V, 80 V, 100 V, and 200 V, respectively.

Depletion layers DL51 to DL54 correspond to the voltages 50 V, 80 V, 100 V, and 200 V, respectively.

FIGS. 28A to 28D are diagrams showing examples of simulation results of changes in a depletion layer of the super junction structure according to the other embodiment. FIGS. 28A to 28D show cases where the reverse voltage Vr is 50 V, 80 V, 100 V, and 200 V, respectively. Depletion layers DL61 to DL64 correspond to the voltages 50 V, 80 V, 100 V, and 200 V, respectively.

Referring to FIGS. 27A to 27D and FIGS. 28A to 28D, it can be seen that, compared to the super junction structure of the comparative example, in the super junction structure of the other embodiment, the depletion layer spreads gentler at the termination of the turn-off time. Therefore, the silicon carbide semiconductor device having the super junction structure of the other embodiment can also achieve the same effects as those of the silicon carbide semiconductor devices according to the embodiments described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A silicon carbide semiconductor device comprising:
a first electrode;
a second electrode;
a first semiconductor layer provided between the first electrode and the second electrode and containing silicon carbide;
a plurality of first semiconductor pillar regions of a first conductivity type containing silicon carbide, the plurality of first semiconductor pillar regions being provided between the first semiconductor layer and the second electrode, the plurality of first semiconductor pillar regions each including
a first region having a first impurity concentration, and
a second region provided together with the first region in a second direction orthogonal to a first direction from the first electrode toward the second electrode and having a second impurity concentration higher than the first impurity concentration; and
a second semiconductor pillar region of a second conductivity type containing silicon carbide, the second semiconductor pillar region being provided between the first semiconductor layer and the second electrode and located between adjacent ones of the plurality of first semiconductor pillar regions in the second direction, the second semiconductor pillar region including:
a third region having a third impurity concentration, and
a fourth region provided together with the third region in the second direction and having a fourth impurity concentration higher than the third impurity concentration, wherein:
a concentration difference between the first impurity concentration of the first region and the second impurity concentration of the second region is stepwise, and
a concentration difference between the third impurity concentration of the third region and the fourth impurity concentration of the fourth region is stepwise.

2. The device according to claim 1, further comprising:
a second semiconductor layer provided between the first semiconductor layer and the plurality of first semiconductor pillar regions and between the first semiconductor layer and the second semiconductor pillar region.

3. The device according to claim 1, wherein
the plurality of first semiconductor pillar regions are stripe-shaped regions extending in a direction orthogonal to the first direction and the second direction on the first semiconductor layer, and
the second semiconductor pillar region is a stripe-shaped region contiguous to the plurality of first semiconductor pillar regions on the first semiconductor layer.

4. The device according to claim 1, wherein
the second semiconductor pillar region is a rectangular region on the first semiconductor layer, and
the plurality of first semiconductor pillar regions are rectangular regions surrounding the second semiconductor pillar region on the first semiconductor layer.

5. The device according to claim 1, wherein
the second region is provided between two of the first regions in the second direction, and
the fourth region is provided between two of the third regions in the second direction.

6. The device according to claim 1, further comprising:
a plurality of base layers of the second conductivity type, each of the plurality of base layers being formed on the second semiconductor pillar region and having opposite ends formed on the plurality of first semiconductor pillar regions contiguous to the second semiconductor pillar region;
a plurality of source layer of the first or second conductivity type formed on the plurality of base layers and connected to the second electrode;
a pillar region of the first conductivity type formed on the plurality of first semiconductor pillar regions and between adjacent ones of the plurality of base layers; and
a gate electrode provided on the plurality of base layers and the source layer through an insulating film.

7. The device according to claim 1, further comprising:
a first semiconductor region of the second conductivity type formed on the second semiconductor pillar region;
a second semiconductor region of the first conductivity type formed on the plurality of first semiconductor pillar regions and the first semiconductor region;
a base layer of the second conductivity type formed on the second semiconductor region;
a source layer of the first conductivity type formed on the base layer and connected to the second electrode; and
a gate electrode facing the source layer and the base layer through an insulating film in the direction orthogonal to the direction from the first electrode toward the second electrode.

8. The device according to claim 7, wherein
the first semiconductor region includes
a first portion not connected to the base layer, and
a second portion connected to the base layer.

9. The device according to claim 1, further comprising:
a first semiconductor region of the first conductivity type formed on the first semiconductor pillar regions;
a second semiconductor region of the second conductivity type formed on the second semiconductor pillar region;

a base layer of the second conductivity type formed on the first semiconductor region and the second semiconductor region;

a source layer of the first conductivity type formed on the base layer and connected to the second electrode; and a gate electrode facing the source layer and the base layer through an insulating film in the direction orthogonal to the direction from the first electrode toward the second electrode, the insulating film protruding toward the second electrode.

10. The device according to claim 1, further comprising:

a first semiconductor region of the second conductivity type formed on the second semiconductor pillar region;

a second semiconductor region of the second conductivity type formed over the second region and a part of the first region contiguous to the second region;

a third semiconductor region of the first conductivity type formed on the second semiconductor region;

a base layer of the second conductivity type formed on the first semiconductor region and the third semiconductor region;

a source layer of the first conductivity type formed on the base layer; and a gate electrode facing the base layer and the source layer through an insulating film in the direction orthogonal to the direction from the first electrode toward the second electrode.

11. The device according to claim 10, wherein
the second semiconductor region includes
a first portion not connected to the first semiconductor region, and
a second portion connected to the first semiconductor region.

12. The device according to claim 1, wherein
in the second direction orthogonal to the first direction from the first electrode toward the second electrode, a width of the first region and a width of the third region are substantially the same, and a width of the second region and a width of the fourth region are substantially the same.

13. The device according to claim 1, wherein
in the second direction orthogonal to the first direction from the first electrode toward the second electrode, a width of the first region is half a width of the second region, and a width of the third region is half a width of the fourth region.

14. A silicon carbide semiconductor device comprising:
a first electrode;
a second electrode;
a first semiconductor layer provided between the first electrode and the second electrode and containing silicon carbide;
a plurality of first semiconductor pillar regions of a first conductivity type containing silicon carbide, the plurality of first semiconductor pillar regions being provided between the first semiconductor layer and the second electrode, the plurality of first semiconductor pillar regions each including:
a first region having a first impurity concentration;
a second region provided together with the first region in a second direction orthogonal to a first direction from the first electrode toward the second electrode and having a second impurity concentration higher than the first impurity concentration; and
a second semiconductor pillar region of a second conductivity type containing silicon carbide, the second semiconductor pillar region being provided between the first semiconductor layer and the second electrode and located between the plurality of first semiconductor pillar regions in the second direction, wherein:
a concentration difference between the first impurity concentration of the first region and the second impurity concentration of the second region is stepwise, and
a concentration difference between a third impurity concentration of a third region and a fourth impurity concentration of a fourth region is stepwise.

* * * * *